(12) United States Patent
Hanaoka et al.

(10) Patent No.: US 8,415,228 B2
(45) Date of Patent: Apr. 9, 2013

(54) MANUFACTURING METHOD OF SOI SUBSTRATE AND SEMICONDUCTOR DEVICE

(75) Inventors: Kazuya Hanaoka, Chigasaki (JP); Takashi Shingu, Atsugi (JP); Taichi Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 506 days.

(21) Appl. No.: 12/555,825

(22) Filed: Sep. 9, 2009

(65) Prior Publication Data

US 2010/0062583 A1 Mar. 11, 2010

(30) Foreign Application Priority Data

Sep. 11, 2008 (JP) .................................. 2008-233270

(51) Int. Cl.
*H01L 21/30* (2006.01)
(52) U.S. Cl. .................. 438/458; 257/347; 257/E27.112
(58) Field of Classification Search .................. 257/347, 257/E27.112; 438/458
See application file for complete search history.

(56) References Cited

U.S. PATENT DOCUMENTS

| | | | |
|---|---|---|---|
| 6,146,970 | A | 11/2000 | Witek et al. |
| 6,335,231 | B1 | 1/2002 | Yamazaki et al. |
| 6,380,046 | B1 | 4/2002 | Yamazaki |

(Continued)

FOREIGN PATENT DOCUMENTS

| | | |
|---|---|---|
| JP | 2004-087606 | 3/2004 |
| JP | 2004-281878 | 10/2004 |
| JP | 2004-281878 A | 10/2004 |
| JP | 2007-142263 A | 6/2007 |

OTHER PUBLICATIONS

Wei et al., "Effects of Processing Variables on Tantalum Nitride by Reactive-Ion-Assisten Magnetron Sputtering Deposition". Japanese Journal of Applied Physics, vol. 45, No. 8A, 2006, pp. 6405-6410.*

(Continued)

*Primary Examiner* — Thao Le
*Assistant Examiner* — Allen Parker
(74) *Attorney, Agent, or Firm* — Eric J. Robinson; Robinson Intellectual Property Law Office, P.C.

(57) ABSTRACT

To provide a manufacturing method of a semiconductor device in which, even when the semiconductor device is formed over an SOI substrate which uses a glass substrate, an insulating film and a semiconductor film over the glass substrate are not peeled by stress applied by a conductive film in formation of the conductive film for forming a gate electrode. A semiconductor device is manufactured by the steps of forming a first insulating film over a bond substrate, forming an embrittlement layer by adding ions from a surface of the bond substrate, bonding the bond substrate to a glass substrate with the first insulating film interposed therebetween, separating the bond substrate along the embrittlement layer to form a semiconductor film over the glass substrate with the first insulating film interposed therebetween, removing a peripheral region of the first insulating film and the semiconductor film to expose part of the glass substrate, forming a gate insulating film over and in contact with the semiconductor film and the glass substrate, and forming a stacked conductive film over and in contact with the gate insulating film, in which the stacked conductive film includes a conductive film having a tensile stress and a conductive film having a compressive stress.

46 Claims, 17 Drawing Sheets

U.S. PATENT DOCUMENTS

| | | |
|---|---|---|
| 6,611,041 B2 | 8/2003 | Maeda et al. |
| 6,797,632 B1* | 9/2004 | Nakano et al. ............... 438/704 |
| 7,119,365 B2 | 10/2006 | Takafuji et al. |
| 7,132,317 B2 | 11/2006 | Arao |
| 7,245,018 B1 | 7/2007 | Takayama et al. |
| 2002/0179908 A1* | 12/2002 | Arao ............... 257/72 |
| 2004/0178447 A1* | 9/2004 | Yeo et al. ............... 257/347 |
| 2006/0115986 A1* | 6/2006 | Donohoe et al. ............ 438/690 |
| 2007/0065995 A1 | 3/2007 | Arao |
| 2007/0281401 A1* | 12/2007 | Yamazaki et al. ............ 438/151 |
| 2008/0014666 A1 | 1/2008 | Takayama et al. |
| 2008/0224274 A1 | 9/2008 | Yamazaki et al. |
| 2008/0237779 A1 | 10/2008 | Yamazaki et al. |
| 2008/0242050 A1 | 10/2008 | Yamazaki et al. |
| 2009/0170285 A1* | 7/2009 | Soeta et al. ............... 438/458 |
| 2010/0304507 A1* | 12/2010 | Bouchet al. ............... 438/16 |

OTHER PUBLICATIONS

Bouziane et al., "DC magnetron sputtered tungsten: W film properties and electrical properties of W / Si Schottky diodes" Applied Physics A. 81, 209-215 (2005).*

Quirk et al. "Semiconductor Manufacturing Technology". 2001. pp. 277-278.*

* cited by examiner

MANUFACTURING METHOD OF SOI SUBSTRATE AND SEMICONDUCTOR DEVICE

BACKGROUND OF THE INVENTION

1. Field of the Invention

The present invention relates to a manufacturing method of a semiconductor device that uses a substrate provided with a semiconductor layer with an insulating film interposed therebetween, in particular, an SOI (silicon on insulator) substrate.

2. Description of the Related Art

In recent years, integrated circuits that use an SOI (silicon on insulator) substrate in which a thin single crystal semiconductor layer is provided on an insulating surface, instead of a bulk silicon wafer, have been developed. By utilizing characteristics of a thin single crystal silicon film formed over an insulating film, transistors formed in the integrated circuit can be separated from each other completely. Further, since fully-depleted transistors can be formed, a semiconductor integrated circuit with high added value such as high integration, high speed driving, and low power consumption can be realized.

As one of the methods for manufacturing SOI substrates, a Smart Cut (registered trademark) method is given. By a Smart Cut method, an SOI substrate having a single crystal silicon film over not only a silicon substrate but also an insulating substrate such as a glass substrate can be manufactured (see Patent Document 1, for example). A manufacturing method of an SOI substrate having a single crystal silicon thin film over a glass substrate, in which a Smart Cut method is used, is briefly described below. First, a silicon dioxide film is formed over a surface of a single crystal silicon wafer. Next, by implantation of a hydrogen ion into the single crystal silicon wafer, a hydrogen ion implantation plane is formed at a predetermined depth in the single crystal silicon wafer. Then, the single crystal silicon wafer into which the hydrogen ion is implanted is bonded to a glass substrate with the silicon dioxide film interposed therebetween. After that, heat treatment is performed, whereby the hydrogen ion implantation plane serves as a cleavage plane and a thin film of the single crystal silicon wafer into which the hydrogen ion is implanted is separated. In this manner, a single crystal silicon thin film can be formed over the bonded glass substrate. This Smart Cut method may also be referred to as a hydrogen ion implantation separation method.

In manufacturing an SOI substrate by a Smart Cut method or the like, there is a possibility that a defect would be generated in a peripheral portion of a single crystal silicon layer and a bonded insulating layer over a supporting substrate. Therefore, a technique of removing the peripheral portion of the single crystal silicon layer and the bonded insulating layer is disclosed (e.g., see Patent Document 2).

REFERENCE

Patent Document

[Patent Document 1] Japanese Published Patent Application No. 2004-87606
[Patent Document 2] Japanese Published Patent Application No. 2004-281878

SUMMARY OF THE INVENTION

In manufacturing an SOI substrate, a bond substrate provided with an insulating film is bonded to a base substrate, so that a semiconductor film is formed over the base substrate with the insulating film interposed therebetween. However, the adhesion between a peripheral region of the insulating film and the base substrate is lower than the adhesion between a central region of the insulating film and the base substrate. In the case of manufacturing a semiconductor element such as a thin film transistor (TFT) using such an SOI substrate, there is a possibility that at the time of forming a conductive film for forming a gate electrode, a peripheral portion of the insulating film, in which the adhesion with the base substrate is low, cannot withstand the stress applied by the conductive film, and accordingly the conductive film, the insulating film, and the semiconductor film over the base substrate are peeled. Particles of the peeled conductive film, insulating film, and semiconductor film cause electrical short circuit between regions of wirings which should be separated, separation of portions which should be electrically connected, and the like and disturb formation of a wiring pattern.

In particular, in the case of using a glass substrate as a base substrate, a possibility that the insulating film and the semiconductor film over the base substrate are peeled becomes higher because the glass substrate is less planar and is sometimes curved as compared to a silicon substrate. Accordingly, there is a possibility that peeling of the insulating film and the semiconductor film cannot be prevented only by removing the peripheral portion of the insulating film and the semiconductor film as in Patent Document 2 where the peripheral portion of the single crystal silicon layer and the bonded insulating layer is removed.

In consideration of the above-described problem, an object of an embodiment of the present invention is to provide a manufacturing method of a semiconductor device in which, even when the semiconductor device is formed over an SOI substrate which uses a glass substrate, an insulating film and a semiconductor film over the glass substrate are not peeled by the stress applied by a conductive film in formation of the conductive film for forming a gate electrode.

A semiconductor device according to an embodiment of the present invention is manufactured in such a manner that a peripheral region of an insulating film and a semiconductor film formed over a glass substrate is removed to expose part of the glass substrate and that a conductive film with a stacked structure including a conductive film having a tensile stress and a conductive film having a compressive stress is used as a conductive film for forming a gate electrode.

A manufacturing method of a semiconductor device according to an embodiment of the present invention includes the steps of forming a first insulating film over a bond substrate, forming an embrittlement layer by adding ions from a surface of the bond substrate, bonding the bond substrate to a glass substrate with the first insulating film interposed therebetween, separating the bond substrate along the embrittlement layer to form a semiconductor film over the glass substrate with the first insulating film interposed therebetween, removing a peripheral region of the first insulating film and the semiconductor film to expose part of the glass substrate, forming a gate insulating film over and in contact with the semiconductor film, the first insulating film, and the glass substrate, and forming a stacked conductive film over and in contact with the gate insulating film, in which the stacked conductive film includes a conductive film having a tensile stress and a conductive film having a compressive stress.

A manufacturing method of a semiconductor device according to an embodiment of the present invention includes the steps of forming a first insulating film over a bond substrate, forming an embrittlement layer by adding ions from a surface of the bond substrate, bonding the bond substrate to a glass substrate with the first insulating film interposed therebetween, separating the bond substrate along the embrittlement layer to form a semiconductor film over the glass substrate with the first insulating film interposed therebetween, removing a peripheral region of the first insulating film and the semiconductor film to expose part of the glass substrate, forming a gate insulating film over and in contact with the semiconductor film, the first insulating film, and the glass substrate, and forming a stacked conductive film with a two-layer structure over and in contact with the gate insulating film, in which the stacked conductive film with a two-layer structure includes a conductive film having a tensile stress in an upper layer and a conductive film having a compressive stress in a lower layer.

A manufacturing method of a semiconductor device according to an embodiment of the present invention includes the steps of forming a first insulating film over a bond substrate, forming an embrittlement layer by adding ions from a surface of the bond substrate, bonding the bond substrate to a glass substrate with the first insulating film interposed therebetween, separating the bond substrate along the embrittlement layer to form a semiconductor film over the glass substrate with the first insulating film interposed therebetween, removing a peripheral region of the first insulating film and the semiconductor film to expose part of the glass substrate, forming a gate insulating film over and in contact with the semiconductor film, the first insulating film, and the glass substrate, and forming a stacked conductive film over and in contact with the gate insulating film, in which the stacked conductive film is formed under such conditions that the stacked conductive film has a stress of 0.1 GPa or lower.

Note that in the manufacturing method of a semiconductor device according to an embodiment of the present invention, a second insulating film is preferably formed over the glass substrate. It is preferable that the conductive film having a tensile stress be a tungsten film, and the conductive film having a compressive stress be a tantalum nitride film. The stacked conductive film preferably has a two-layer structure including the tungsten film in an upper layer and the tantalum nitride film in a lower layer. In addition, the peripheral region is preferably a band-like region from an outermost edge of the semiconductor film or the second insulating film to a place which is 1 mm to 10 mm inward than an outermost edge of the semiconductor film. Further, removal of the semiconductor film and the insulating film is preferably performed by dry etching.

The first insulating film is preferably a single film or a stacked layer of a plurality of films selected from a silicon oxide film, a silicon nitride film, a silicon oxynitride film, or a silicon nitride oxide film. The silicon oxide film is preferably formed by thermally oxidizing the bond substrate. Further, the second insulating film is preferably a film selected from a silicon nitride film, a silicon nitride oxide film, an aluminum nitride film, or an aluminum nitride oxide film. Furthermore, the bond substrate is preferably a single crystal silicon substrate. In addition, the glass substrate is preferably aluminosilicate glass, barium borosilicate glass, or aluminoborosilicate glass.

According to an embodiment of the present invention, even when an SOI substrate in which a semiconductor film is formed over a glass substrate is used, a conductive film, the semiconductor film, and an insulating film are prevented from being peeled by stress that the conductive film has, in formation of the conductive film used as a gate electrode. In addition, formation of a wiring pattern is not disturbed by particles of the peeled conductive film, insulating film, and semiconductor film. Therefore, a semiconductor device which has high reliability sufficient for practical use can be manufactured. Furthermore, reduction in yield due to peeling of the conductive film, the semiconductor film, and the insulating film during manufacture of a semiconductor device can be prevented.

DETAILED DESCRIPTION OF THE INVENTION

Figure 1A:
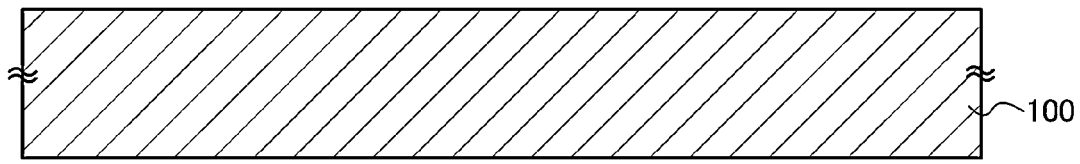
FIGS. 1A to 1C illustrate an example of a manufacturing method of an SOI substrate according to an embodiment of the present invention.

Hereinafter, embodiments of the present invention will be described in detail with reference to the accompanying drawings. However, the present invention can be implemented in various modes, and it is easily understood by those skilled in the art that modes and details can be variously changed without departing from the scope and the spirit of the present invention. Therefore, the present invention should not be interpreted as being limited to the description of the embodiments to be given below. Note that common portions and portions having a similar function are denoted by the same reference numerals in the drawings in this specification, and description thereof may be omitted.

Embodiment 1

In a manufacturing method of a semiconductor device according to Embodiment 1, an SOI substrate is manufactured in such a manner that a semiconductor film separated from a semiconductor substrate which is a bond substrate is bonded to a base substrate. Then, with the use of the manufactured SOI substrate, a semiconductor device is manufactured. A manufacturing method of a semiconductor device according to this embodiment will be described below with reference to FIGS. 1A to 1C, FIGS. 2A to 2C, FIGS. 3A to 3C, FIGS. 4A to 4D, FIGS. 5A to 5C, FIGS. 6A to 6C, and FIGS. 8A to 8C.

First, a bond substrate 100 as illustrated in FIG. 1A is prepared. As the bond substrate 100, a commercial semiconductor substrate can be used; for example, a single crystal semiconductor substrate or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 100. The single crystal semiconductor substrate can be manufactured by a CZ (Czochralski) method or a FZ (floating zone) method.

Commercial silicon substrates typically have circular shapes with sizes of 5 inches (125 mm), 6 inches (150 mm), 8 inches (200 mm), 12 inches (300 mm), and 16 inches (400 mm) in diameter; however, the shape of the bond substrate 100 is not limited to the circular shapes. The bond substrate 100 preferably has a rectangular shape or a polygonal shape in this embodiment. For example, a circular silicon substrate can be processed into a rectangular shape or the like to be used as the bond substrate 100. Note that the rectangular shape in this specification includes a square and a rectangle. In the description given below, a case in which a single crystal silicon substrate is used as the bond substrate 100 will be described.

Figure 1B:
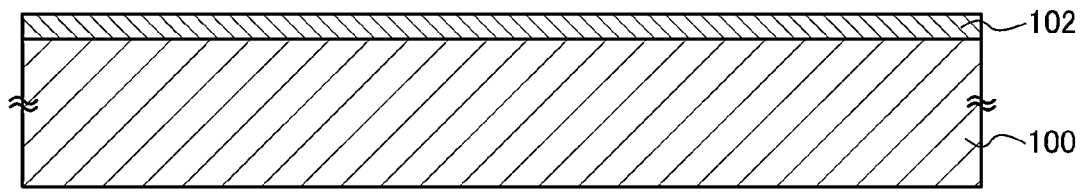

Next, as illustrated in FIG. 1B, an insulating film 102 is formed over the bond substrate 100. The insulating film 102 may be either a single insulating film or a stack layer including a plurality of insulating films. For example, in this embodiment, silicon oxide is used for the insulating film 102. An insulating film containing silicon as its component such as a silicon oxide film, a silicon nitride film, a silicon oxynitride film, or a silicon nitride oxide film is preferably used as a film included in the insulating film 102. Further, it is preferable that a surface of the bond substrate 100 be cleaned in advance with a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like.

Note that in this specification, a silicon oxynitride film means a film that contains more oxygen atoms than nitrogen atoms and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film means a film that contains more nitrogen atoms than oxygen atoms and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

In the case of using silicon oxide for the insulating film 102, the insulating film 102 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 102 may be densified by oxygen plasma treatment.

Alternatively, silicon oxide deposited by a chemical vapor deposition method using an organosilane gas may be used as the insulating film 102. For the organosilane gas, any of the following compounds containing silicon can be used: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), and the like.

Alternatively, the insulating film 102 can be formed using an oxide film obtained by thermally oxidizing the bond substrate 100. For thermal oxidation treatment for forming the oxide film, dry oxidation may be performed, and a gas containing halogen may be added in an oxidation atmosphere. As the halogen-containing gas, one or plural kinds of gases selected from HCl, HF, $NF_3$, HBr, $Cl_2$, ClF, $BCl_3$, $F_2$, $Br_2$, and the like can be used. Although the insulating film 102 is formed over only one surface of the bond substrate 100 in FIG. 1B, this embodiment is not limited thereto. In the case of forming the insulating film 102 using an oxide film obtained by oxidizing the bond substrate 100, the insulating film 102 may be formed so as to surround the bond substrate 100.

For example, heat treatment is performed in an atmosphere that contains 0.5 vol. % to 10 vol. % (preferably 2 vol. %) of hydrogen chloride (HCl) with respect to oxygen, at a temperature in a range of from 700° C. to 1100° C. inclusive. For example, heat treatment may be performed at approximately 950° C. The treatment time may be 0.1 to 6 hours, preferably 2.5 to 3.5 hours. The thickness of the formed oxide film may be 15 nm to 1100 nm, preferably, 50 nm to 150 nm.

By this thermal oxidation treatment in the atmosphere containing halogen, halogen can be contained in the oxide film. When the oxide film contains halogen at a concentration of $1\times10^{17}$ atoms/cm$^3$ to $1\times10^{21}$ atoms/cm$^3$, the oxide film captures a heavy metal that is an extrinsic impurity (e.g., Fe, Cr, Ni, Mo, or the like); therefore, contamination of a semiconductor film to be formed later can be prevented. Moreover, since the halogen used in the oxidation treatment terminates defects of a surface of the bond substrate 100, the local level density of an interface between the oxide film and the bond substrate 100 can be reduced.

When halogen such as chlorine is contained in the insulating film 102 by thermal oxidation treatment or the like in an atmosphere containing halogen, impurities (e.g., a mobile ion such as Na) which cause an adverse effect on the bond substrate 100 can be gettered. Specifically, by heat treatment performed after formation of the insulating film 102, the impurities included in the bond substrate 100 separate out to the insulating film 102 and react with halogen (e.g., chlorine atoms) to be captured. Thus, the impurities captured in the insulating film 102 are fixed, whereby contamination of the bond substrate 100 can be prevented. Further, in the case where the insulating film 102 is bonded to a glass substrate, the insulating film 102 can function as a film for fixing impurities such as Na included in glass.

If a substrate, such as a glass substrate, including impurities which decrease reliability of a semiconductor device, such as an alkali metal or an alkaline-earth metal, is used as a base substrate, at least one layer which can prevent diffusion of the impurities from the base substrate into a semiconductor film of the SOI substrate is preferably included in the insulating film 102. As such a film, a silicon nitride film, a silicon nitride oxide film, and the like can be given. With such a film included in the insulating film 102, the insulating film 102 can function as a barrier film.

In the case of using a silicon nitride film as the insulating film 102, the insulating film can be formed by a vapor deposition method such as plasma CVD using a mixed gas of silane and ammonia. In addition, in the case of using a silicon nitride oxide film as the insulating film 102, the insulating film can be formed by a vapor deposition method such as plasma CVD using a mixed gas of silane and ammonium or a mixed gas of silane and nitrogen oxide.

For example, in the case of forming the insulating film 102 as a single-layer barrier film, a silicon nitride film or a silicon nitride oxide film with a thickness of from 15 nm to 300 nm inclusive can be formed.

In the case of forming a two-layer barrier film as the insulating film 102, the upper layer is formed using an insulating film with a high barrier property. The upper insulating film can be formed using a silicon nitride film or a silicon nitride oxide film with a thickness of, for example, from 15 nm to 300 nm inclusive. These films have a high blocking effect for preventing impurity diffusion, but their internal stress is also high. Therefore, as the lower insulating film that is in contact with the bond substrate 100, a film with an effect of relieving the stress of the upper insulating film is preferably selected. As the insulating film with an effect of relieving the stress of the upper insulating film, a silicon oxide film, a silicon oxynitride film, a thermally oxidized film formed by thermally oxidizing the bond substrate 100, and the like are given. The thickness of the lower insulating film can be from 5 nm to 200 nm inclusive.

For example, in order for the insulating film 102 to function as a blocking film, the insulating film 102 may be formed by a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

By forming an additional film over the two-layer barrier film, the insulating film 102 may have a three-layer structure. In such a case, the insulating film in the uppermost layer preferably has a smooth and highly hydrophilic surface since it is bonded to the base substrate. Therefore, the insulating film in the uppermost layer is preferably an insulating film formed by a chemical vapor reaction, and a silicon oxide film is specifically preferable. In the case of forming a silicon oxide film by a plasma-enhanced CVD method as the insulating film in the uppermost layer, it is preferable to use an organosilane gas and an oxygen ($O_2$) gas as a source gas. By using organosilane as the source gas, it is possible to form a silicon oxide film having a smooth surface at a process temperature of 350° C. or lower. Alternatively, the insulating film in the uppermost layer can be formed by a thermal CVD method using a low temperature oxide (LTO) which is formed at a heating temperature of from 200° C. to 500° C. inclusive. The LTO can be formed by using monosilane ($SiH_4$), disilane ($Si_2H_6$), or the like as a silicon source gas and using dinitrogen monoxide ($N_2O$) or the like as an oxygen source gas.

Further, the thickness of the insulating film in the uppermost layer can be set to be greater than or equal to 5 nm and less than or equal to 500 nm, more preferably greater than or equal to 10 nm and less than or equal to 200 nm.

For example, in the case of using TEOS and $O_2$ for the source gas to form the silicon oxide film as the insulating film in the uppermost layer, the conditions may be set as follows: the flow rate of TEOS is 15 sccm, the flow rate of $O_2$ is 750 sccm, the film forming pressure is 100 Pa, the film forming temperature is 300° C., the RF output is 300 W, and the power source frequency is 13.56 MHz.

It is to be noted that an insulating film formed at a relatively low temperature, such as a silicon oxide film formed using organosilane or a silicon nitride oxide film formed at a low temperature, has a number of OH groups on its surface. Hydrogen bonding between the OH group and a water molecule forms a silanol group and bonds the base substrate and the insulating film at a low temperature. A siloxane bond, which is a covalent bond, is formed finally between the base substrate and the insulating film. Therefore, the insulating film such as the aforementioned silicon oxide film formed using organosilane or the LTO formed at a relatively low temperature is suitable for bonding at a low temperature, as compared with a thermally oxidized film having no OH bond or having very few OH bonds which is used in Smart Cut or the like.

Figure 1C:
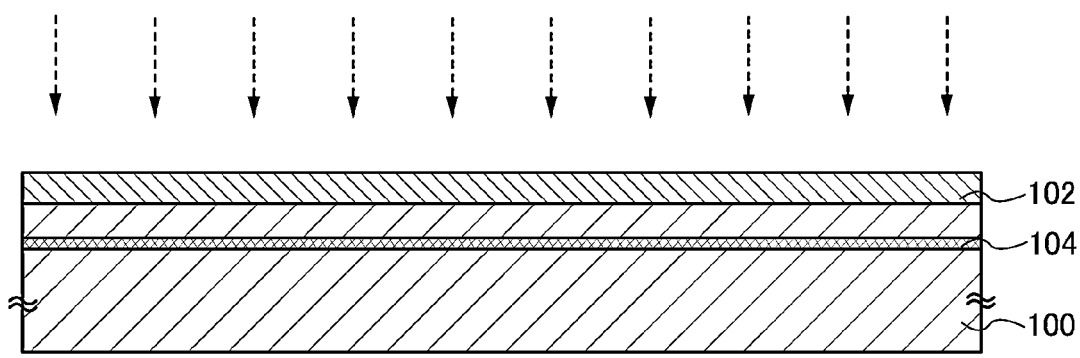

Next, as illustrated in FIG. 1C, an ion beam including ions accelerated by an electric field is emitted to the bond substrate 100 through the insulating film 102 as indicated by arrows. Thus, an embrittlement layer 104 having microvoids is formed in a region at a predetermined depth from the surface of the bond substrate 100. The depth at which the embrittlement layer 104 is formed can be adjusted by the acceleration energy of the ion beam and the incident angle of the ion beam. The acceleration energy can be adjusted by an acceleration voltage or the like. The embrittlement layer 104 is formed in a region at the same depth or substantially the same depth as the average penetration depth of the ions. The thickness of a semiconductor film 112 which will separate from the bond substrate 100 is determined based on the depth at which the ions are added. The depth at which the embrittlement layer 104 is formed can be set in a range of, for example, 50 nm to 500 nm inclusive, preferably 50 nm to 200 nm inclusive, for example, about 100 nm, from the surface of the bond substrate 100. Note that irradiation of ions is performed after formation of the insulating film 102 in this embodiment; however, the present invention is not limited to this and the irradiation of ions may be performed before the formation of the insulating film 102. In the case of using a thermally oxidized film of the bond substrate 100 as the insulating film 102, the insulating film 102 is formed at a high temperature of 700° C. or higher; in such a case, the insulating film 102 needs to be formed before the irradiation of ions.

The irradiation of the bond substrate 100 with ions is desirably performed by an ion doping method in which mass separation is not conducted in terms of shortening the takt time; however, this embodiment may employ an ion implantation method in which mass separation is conducted. The ion doping method can be performed using an ion doping apparatus. An ion doping apparatus is typically a non-mass-separation type apparatus for irradiating a process object which is disposed in a chamber with all kinds of ion species which are generated by plasma excitation of a process gas. The non-mass-separation type apparatus is an apparatus with which a process object is irradiated with all kinds of ion species without mass separation of ion species in plasma. In contrast, an ion implantation apparatus used in an ion implantation method is a mass-separation type apparatus. The ion implantation apparatus is an apparatus with which a process object is irradiated with ion species having a specific mass through mass separation of ion species in plasma.

Main components of the ion doping apparatus are as follows: a chamber in which a process object is disposed; an ion source for generating desired ions; and an acceleration mechanism for acceleration of ions and for irradiation therewith. The ion source includes a gas supply device for supplying a source gas to generate a desired ion species, an electrode for exciting the source gas to produce plasma, and the like. As the electrode for producing plasma, a capacitively-coupled high-frequency discharge electrode, a filament electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated in the ion source are accelerated. Note that the components of the ion doping apparatus are not limited to the above-mentioned components, and a mechanism as needed is provided.

When hydrogen ($H_2$) is used for a source gas, $H^+$, $H_2^+$, and $H_3^+$ can be produced by exciting a hydrogen gas. The proportion of ion species produced from the source gas can be changed by adjusting a plasma excitation method, pressure in an atmosphere for generating plasma, the amount of supplied source gas, and the like. In the case where the ion irradiation is performed by an ion doping method, it is preferable that $H_3^+$ be contained at 50% or more with respect to the total amount of $H^+$, $H_2^+$, and $H_3^+$ in the ion beam, and it is more preferable that the proportion of $H_3^+$ be 80% or more. When $H_3^+$ occupies 50% or more, the proportion of $H_2^+$ ions in the ion beam becomes smaller relatively, which results in lower variation in the average penetration depth of the hydrogen ions included in the ion beam. Consequently, the ion addition efficiency improves and the takt time can be shortened.

$H_3^+$ has larger mass than $H^+$ and $H_2^+$. When the ion beam containing a larger proportion of $H_3^+$ is compared with the ion beam containing a larger proportion of $H^+$ and $H_2^+$, the former can add hydrogen to a shallower region of the bond substrate 100 than the latter even though the acceleration voltage at the time of doping is the same. Moreover, since the former has a steep concentration profile of hydrogen added to the bond substrate 100 in a thickness direction, the embrittlement layer 104 itself can be formed to be thinner.

In the case where the ion irradiation is performed by an ion doping method using a hydrogen gas, the acceleration voltage is set to be greater than or equal to 10 kV and less than or equal to 200 kV and the dosage can be set to be greater than or equal to $1\times10^{16}$ ions/cm² and less than or equal to $6\times10^{16}$ ions/cm². The embrittlement layer 104 can be formed in a region at a depth of from 50 nm to 500 nm inclusive, preferably from 50 nm to 200 nm inclusive, for example, about 100 nm of the bond substrate 100, though depending on the ion species included in the ion beam and its proportion, and the thickness of the insulating film 102.

Next, surface treatment of the bond substrate 100 over which the insulating film 102 is formed is performed. The surface treatment of the insulating film 102 can be performed by cleaning with ozone water, ultrasonic cleaning with pure water, two-fluid jet cleaning with pure water and nitrogen, irradiation treatment with an atomic beam or an ion beam, ozone treatment, plasma treatment, or radical treatment. Alternatively, a combination of these methods can be employed. When an atomic beam or an ion beam is used, an inert gas neutral atom beam or inert gas ion beam of argon or the like can be used. The ultrasonic cleaning is preferably megahertz ultrasonic cleaning (megasonic cleaning). In the cleaning, a common cleaning agent may be used. By the above-described surface treatment, removal of organic substances and surface activation treatment for improving the hydrophilic property of the surface of the insulating film 102 can be performed. Thus, the bonding strength between the bond substrate and the base substrate can be improved.

Here, an example of ozone treatment will be described. For example, by irradiation with an ultraviolet (UV) ray in an atmosphere containing oxygen, ozone treatment can be performed on the surface of a process object. The ozone treatment in which irradiation with an ultraviolet ray is performed in an atmosphere containing oxygen is also referred to as UV ozone treatment, ultraviolet ray ozone treatment, or the like. By irradiation with ultraviolet light having a wavelength of lower than 200 nm and ultraviolet light having a wavelength of 200 nm or higher in an atmosphere containing oxygen, ozone can be generated and singlet oxygen can be generated from the ozone. By irradiation with ultraviolet light having a wavelength of lower than 180 nm, ozone can be generated and singlet oxygen can also be generated from the ozone.

An example of a reaction caused by irradiation with ultraviolet light having a wavelength of lower than 200 nm and ultraviolet light having a wavelength of 200 nm or higher in an atmosphere containing oxygen is shown below.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the reaction formula (1), by irradiation with ultraviolet light (hν) having a wavelength of lower than 200 nm ($\lambda_1$ nm) in an atmosphere containing oxygen ($O_2$), oxygen atoms in a ground state ($O(^3P)$) are generated. Then, in the reaction formula (2), the oxygen atom in a ground state ($O(^3P)$) and oxygen ($O_2$) react with each other; accordingly, ozone ($O_3$) is generated. Next, in the reaction formula (3), irradiation with ultraviolet light having a wavelength of 200 nm or higher ($\lambda_2$ nm) is performed in an atmosphere containing the generated ozone ($O_3$), whereby singlet oxygen in an excited state $O(^1D)$ is generated. In an atmosphere containing oxygen, by irradiation with ultraviolet light having a wavelength of lower than 200 nm, ozone is generated, and by irradiation with ultraviolet light having a wavelength of 200 nm or higher, the ozone is decomposed and singlet oxygen is generated. The above-described ozone treatment can be performed by, for example, irradiation with a low-pressure mercury lamp ($\lambda_1$=185 nm, $\lambda_2$=254 nm) in an atmosphere containing oxygen.

Further, an example of a reaction caused by irradiation with ultraviolet light having a wavelength of lower than 180 nm in an atmosphere containing oxygen is shown below.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the reaction formula (4), by irradiation with ultraviolet light having a wavelength of lower than 180 nm ($\lambda_3$ nm) in an atmosphere containing oxygen ($O_2$), singlet oxygen in an excited state $O(^1D)$ and an oxygen atom in a ground state ($O(^3P)$) are generated. Then, in the reaction formula (5), the oxygen atom in a ground state ($O(^3P)$) and oxygen ($O_2$) react with each other; accordingly, ozone ($O_3$) is generated. In the reaction formula (6), irradiation with ultraviolet light having a wavelength of lower than 180 nm ($\lambda_3$ nm) is performed in an atmosphere containing the generated ozone ($O_3$), whereby singlet oxygen in an excited state and oxygen are generated. In an atmosphere containing oxygen, by irradiation with ultraviolet light having a wavelength of lower than 180 nm, ozone is generated, and by decomposition of the ozone or oxygen, singlet oxygen is generated. The above-described ozone treatment can be performed by, for example, irradiation with a Xe excimer UV lamp ($\lambda_3$=172 nm) in an atmosphere containing oxygen.

Chemical bonds of organic substances or the like which are attached to the surface of a process object are cut by ultraviolet light having a wavelength of lower than 200 nm. Then, organic substances which are attached to the surface of the process object, organic substances whose chemical bonds are cut, or the like can be oxidatively decomposed by ozone or singlet oxygen generated from ozone and can be removed. The above-described ozone treatment can increase a hydrophilic property and cleanliness of the surface of the process object; accordingly, bonding can be favorably performed.

By irradiation with ultraviolet rays in an atmosphere containing oxygen, ozone is generated. Ozone has an effect of removing organic substances which are attached to a surface of a process object. In addition, singlet oxygen has an effect of removing organic substances which are attached to a surface of a process object at a level equivalent to or more than the ozone. Ozone and singlet oxygen are examples of oxygen in an active state and also collectively referred to as active oxygen. As described in the above reaction formulae and the like, there are a reaction in which ozone is generated in generation of singlet oxygen and a reaction in which singlet oxygen is generated from ozone. Therefore, reactions to which singlet oxygen contributes are also referred to as ozone treatment here in convenience.

Next, preparation for bonding a glass substrate 108 serving as a base substrate and the bond substrate 100 is performed. As the glass substrate 108, it is possible to use any of a variety of glass substrates that are used in the electronics industry such as aluminosilicate glass, barium borosilicate glass, and aluminoborosilicate glass. When the glass substrate 108 is an alkali-free glass substrate, contamination of a semiconductor device due to impurities can be suppressed. In addition, the glass substrate 108 is preferably a substrate polished with cerium oxide or the like and having a favorably planar surface. As the surface of the glass substrate 108 is more favorably planar, the bonding strength can be increased. Therefore, when the surface of the glass substrate 108 serves as a bonding surface, the bonding strength can be increased and bonding defects can be reduced by polishing the surface of the glass substrate 108.

As the glass substrate 108, a mother glass substrate which has been developed for manufacturing liquid crystal panels is preferably used. As such a mother glass substrate, substrates having the following sizes are known: the third generation (550 mm×650 mm), the 3.5-th generation (600 mm×720 mm), the fourth generation (680 mm×880 mm, or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), the tenth generation (2850 mm×3050 mm), and the like. By manufacturing an SOI substrate with the use of a large-sized mother glass substrate as the glass substrate 108, the SOI substrate can have a large area. Increase in area of the SOI substrate allows many chips such as ICs or LSIs to be manufactured all at once, and thus the number of chips manufactured from one substrate is increased; therefore, productivity can be significantly increased.

The surface of the glass substrate 108 is preferably cleaned in advance. Specifically, ultrasonic cleaning (megahertz ultrasonic cleaning) is performed on the glass substrate 108 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, the surface of the glass substrate 108 is preferably subjected to ultrasonic cleaning using HPM. Alternatively, two-fluid jet cleaning or cleaning with ozone water may be performed. In the cleaning, a common glass cleaning solution may be used. By cleaning treatment like this, the surface of the glass substrate 108 can be planarized and abrasive particles remaining on the surface can be removed.

Figure 2A:
FIGS. 2A to 2C illustrate the example of the manufacturing method of the SOI substrate according to the embodiment of the present invention.

An insulating film 106 is preferably formed over the glass substrate 108 as illustrated in FIG. 2A. By forming a silicon nitride film, a silicon nitride oxide film, an aluminum nitride film, an aluminum nitride oxide film, or the like which serves as a barrier film as the insulating film 106 over the surface of the glass substrate 108, impurities such as an alkali metal or an alkaline-earth metal can be prevented from entering the bond substrate 100 from the glass substrate 108. The thickness is preferably in a range of from 10 nm to 200 nm inclusive, preferably from 50 nm to 100 nm inclusive. Note that the insulating film 106 is not necessarily formed over the glass substrate 108.

In the case of forming the insulating film 106 over the glass substrate 108, the surface of the insulating film 106 is preferably subjected to surface treatment such as ozone treatment before bonding, in a similar manner to that of the insulating film 102.

Figure 2B:
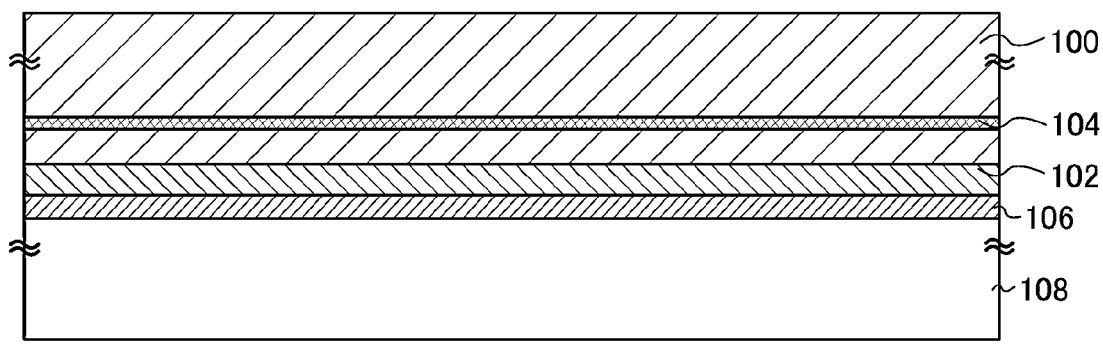

Next, as illustrated in FIG. 2B, the bond substrate 100 and the glass substrate 108 are bonded to each other in such a manner that the insulating film 102 faces the glass substrate 108.

The bonding is performed in such a manner that the insulating film 102 over the surface of the bond substrate 100 and the insulating film 106 over the surface of the glass substrate 108 are disposed in close contact with each other and then a pressure of approximately 0.1 N/cm$^2$ to 500 N/cm$^2$, preferably 1 N/cm$^2$ to 20 N/cm$^2$ is applied to one portion of the glass substrate 108. The insulating film 102 and the insulating film 106 begin to be bonded to each other from the portion of the glass substrate 108 to which the pressure is applied and bonding proceeds spontaneously to the entire surface; thus, the glass substrate 108 and the bond substrate 100 are bonded to each other.

The bonding is performed by Van der Waals force, so that the bonding is strong even at room temperature. By applying pressure to the bond substrate 100 and the glass substrate 108, hydrogen bond can form strong bonding. Note that since the above-described bonding can be performed at a low temperature, a variety of substrates can be used as the glass substrate 108.

However, a region called an edge roll off (E.R.O.) which is thinner and less planar than a central portion of the bond substrate 100 exists in a peripheral portion of the bond substrate 100; therefore, in some cases, the glass substrate 108 and the bond substrate 100 cannot be bonded to each other in the peripheral portion of the bond substrate 100.

After the bond substrate 100 is bonded to the glass substrate 108, heat treatment is preferably performed in order to increase the bonding force at the bonding interface between the insulating film 102 and the insulating film 106. This heat treatment is performed at a temperature at which the embrittlement layer 104 does not crack; specifically, the temperature is in the range of from 200° C. to 450° C. inclusive. Alternatively, the bond substrate 100 may be bonded to the glass substrate 108 while they are heated at a temperature in this range.

This heat treatment can employ an RTA (rapid thermal anneal) apparatus, a resistance heating furnace, or a microwave heating apparatus. As an RTA apparatus, a GRTA (gas rapid thermal anneal) apparatus or an LRTA (lamp rapid thermal anneal) apparatus can be used. The heat treatment for increasing the bonding force at the bonding interface is preferably performed successively in an apparatus or a place where the bonding is performed. In addition, heat treatment for separating the bond substrate 100 along the embrittlement layer 104 as a boundary may be performed in succession to the heat treatment for increasing the bonding force at the bonding interface.

When heat treatment is performed at such a temperature, bonding strength can be usually increased to some extent; however, it is hard to obtain sufficient bonding strength. This is because, when heat treatment is performed after the bond substrate and the base substrate are bonded to each other, bond is strengthened by occurrence of a dehydration condensation reaction and formation of covalent bonds at the bonding interface, but in order to promote the dehydration condensation reaction, moisture generated at the bonding interface through the dehydration condensation reaction needs to be removed by heat treatment at a high temperature. In other words, when heat treatment after bonding is performed at a high temperature, moisture generated at the bonding interface through a dehydration condensation reaction can be removed and bonding strength can be increased. On the other hand, when heat treatment is performed at a low temperature, moisture generated at the bonding interface through a dehydration condensation reaction cannot be removed effectively; thus, the dehydration condensation reaction does not progress and bonding strength cannot be improved sufficiently.

Further, in the case where an oxide film containing a chlorine atom or the like is used as the insulating film 102, moisture can be absorbed and diffused in the insulating film 102. Accordingly, even when heat treatment after the bonding is performed at a low temperature, moisture generated at the bonding interface through the dehydration reaction can be absorbed and diffused in the insulating film 102, whereby the dehydration reaction can be efficiently promoted. In this case, even if a substrate having low heat resistance such as glass is used as the base substrate, the bonding strength between the insulating film 102 and the insulating film 106 can be sufficiently improved. When plasma treatment is performed by application of bias voltage, a micropore is formed in the vicinity of the surface of the insulating film 102 and moisture is effectively absorbed and diffused; thus, even by heat treatment at a low temperature, the bonding strength between the insulating film 102 and the insulating film 106 can be improved.

If the bonding plane is contaminated by dust or the like at the time of bonding the bond substrate 100 and the glass substrate 108, the contaminated portion is not bonded. In order to avoid the contamination of the bonding plane, the bonding of the bond substrate 100 and the glass substrate 108 is preferably performed in an airtight chamber. At the time of bonding the bond substrate 100 and the glass substrate 108, the process chamber may have a pressure reduced to about $5.0 \times 10^{-3}$ Pa and the atmosphere of the bonding process may be cleaned.

Figure 2C:
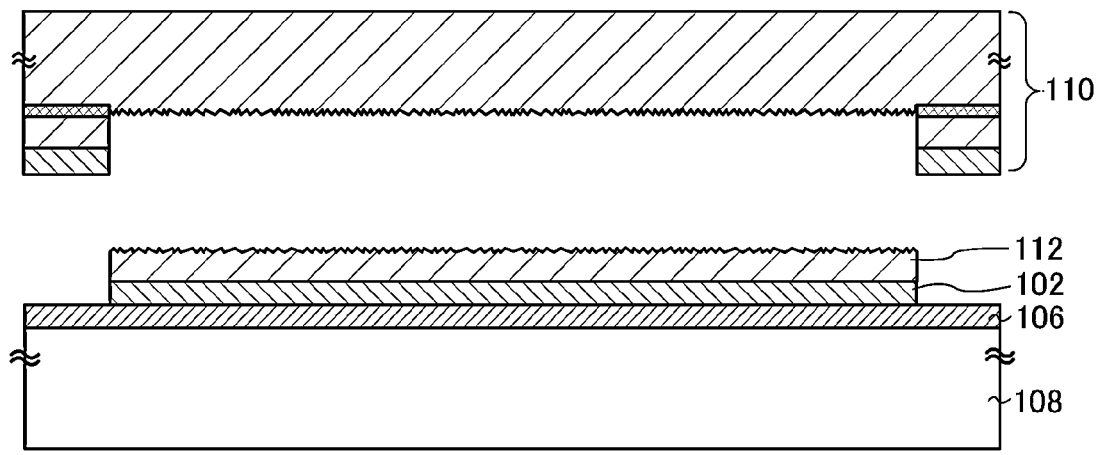

Next, heat treatment is performed on the bond substrate 100, whereby microvoids which are adjacent to each other in the embrittlement layer 104 are combined and the volume of the microvoids increases. As a result, the bond substrate 100 is separated along the embrittlement layer 104 by rapid reaction, and as illustrated in FIG. 2C, the bond substrate 100 is separated into the semiconductor film 112 and a bond substrate 110 after separation. Since the insulating film 102 is bonded to the insulating film 106 over the surface of the glass substrate 108, the semiconductor film 112 which is separated from the bond substrate 100 is fixed to the glass substrate 108. The heat treatment for separating the semiconductor film 112 from the bond substrate 100 is preferably performed at a temperature below a strain point of the glass substrate 108.

This heat treatment can also be performed with an apparatus similar to the apparatus used for the heat treatment for increasing the bonding force at the bonding interface. That is, a rapid thermal anneal (RTA) apparatus, a resistance heating furnace, or a microwave heating apparatus can be used for this heat treatment. As an RTA apparatus, a GRTA (gas rapid thermal anneal) apparatus or an LRTA (lamp rapid thermal anneal) apparatus can be used.

In the case of using a GRTA apparatus, the heating temperature and the treatment time can be in a range of from 550° C. to 650° C. inclusive and from 0.5 minutes to 60 minutes inclusive, respectively. In the case of using a resistance heating apparatus, the heat temperature can be set in a range of from 200° C. to 650° C. inclusive and the treatment time can be set in a range of from 2 hours to 4 hours inclusive.

The heat treatment may be performed by dielectric heating with a high-frequency wave such as a microwave. The heat treatment by dielectric heating can be performed by irradiating the bond substrate 100 with a high-frequency wave with a frequency of 300 MHz to 3 THz generated by a high-frequency wave generation apparatus. Specifically, for example, irradiation with a microwave with a frequency of 2.45 GHz at 900 W is performed for 14 minutes to combine microvoids adjacent to each other in the embrittlement layer, whereby the bond substrate 100 can be separated finally.

However, a peripheral portion of the bond substrate 100 and the insulating film 102 is, in many cases, not bonded to the glass substrate 108 due to an E.R.O. region or the like. When the semiconductor film 112 is separated from the bond substrate 100 in such a condition, the peripheral portion of the bond substrate 100 and the insulating film 102, which is not bonded to the glass substrate 108, remains on the bond substrate 110 formed after separation, and in this manner, a projection portion is formed on the peripheral portion of the bond substrate 110 after separation. The semiconductor film 112 having a size smaller than the bond substrate 100 is bonded to the glass substrate 108. The bonding strength at a peripheral region of the semiconductor film 112 and the insulating film 102 is also low.

It is desirable that the bond substrate 110 formed after separation be subjected to treatment such as chemical mechanical polishing (CMP) to remove the projection portion formed on the peripheral portion of the bond substrate 110 formed after separation and the substrate be used again as the bond substrate 100. The reprocessed semiconductor substrate may be used for another purpose.

Next, the peripheral region of the semiconductor film 112, the insulating film 102, and the insulating film 106 over the glass substrate 108 is removed to expose a part of the glass substrate 108 which is located outer than the semiconductor film 112.

Since the bonding force is weak in the peripheral region of the semiconductor film 112 and the insulating film 102, if the substrate is used as it is as an SOI substrate for manufacturing a TFT, there is a possibility that the semiconductor film 112 and the insulating film 102 may be peeled by stress applied by a conductive film when the conductive film used as a gate electrode is formed. In particular, when the base substrate is rectangular or polygonal, stress concentrates in corner portions; therefore, the possibility that the semiconductor film 112 and the insulating film 102 are peeled becomes high. Furthermore, since the glass substrate 108 is used as the base substrate in this embodiment, the base substrate is less planar and is sometimes curved as compared to the case of using a semiconductor substrate of silicon or the like as a base substrate. Therefore, the possibility that the semiconductor film 112 and the insulating film 102 over the glass substrate 108 are peeled becomes higher. For these reasons, the peripheral region of the semiconductor film 112 and the insulating film 102, where the bonding force with the insulating film 106 is weak, needs to be removed in advance. At this time, the insulating film 106 is preferably removed together with the semiconductor film 112 and the insulating film 102.

Figure 3A:
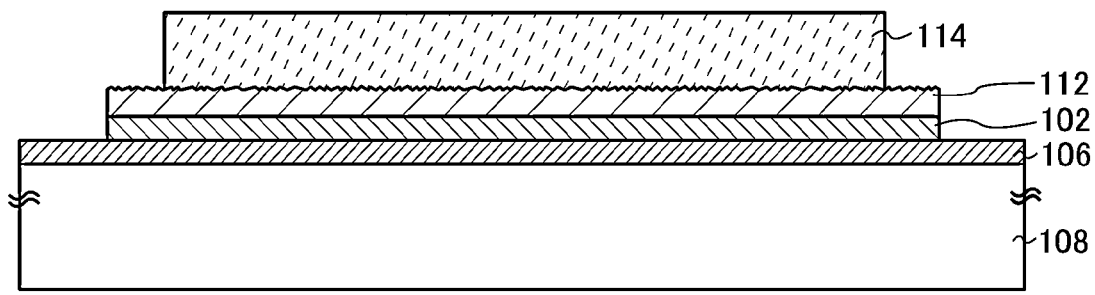
FIGS. 3A to 3C illustrate the example of the manufacturing method of the SOI substrate according to the embodiment of the present invention.

The peripheral region of the semiconductor film 112, the insulating film 102, and the insulating film 106 is preferably removed by photolithography and etching. First, as illustrated in FIG. 3A, a resist mask 114 is formed over the semiconductor film 112. In order to remove the peripheral region of the semiconductor film 112, the shape of the resist mask 114 is similar to the shape of the semiconductor film 112 and has an outermost edge inward than the semiconductor film 112. The resist mask 114 is preferably formed so that the outermost edge of the resist mask 114 is located 1 mm to 10 mm inward than an outermost edge of the semiconductor film 112. For example, the resist mask 114 may be formed so that the outermost edge thereof is located about 6 mm inward than the outermost edge of the semiconductor film 112. At this time, if a peripheral exposure apparatus is used, the resist mask 114 can be easily shaped to be similar to the shape of the semiconductor film 112 and have an outermost edge inward than the semiconductor film 112.

Figure 8A:
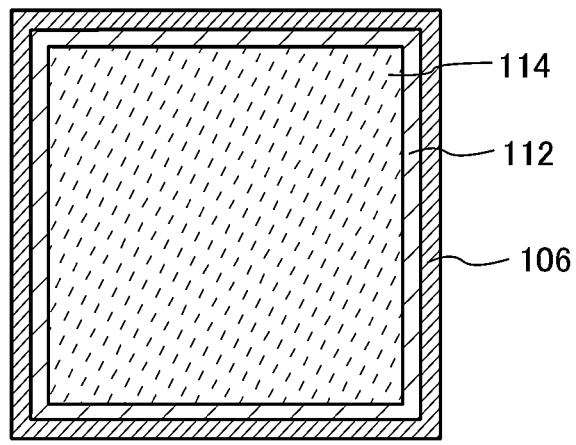
FIGS. 8A to 8C are plan views illustrating examples of a manufacturing method of a semiconductor device according to an embodiment of the present invention.
Figure 8B:
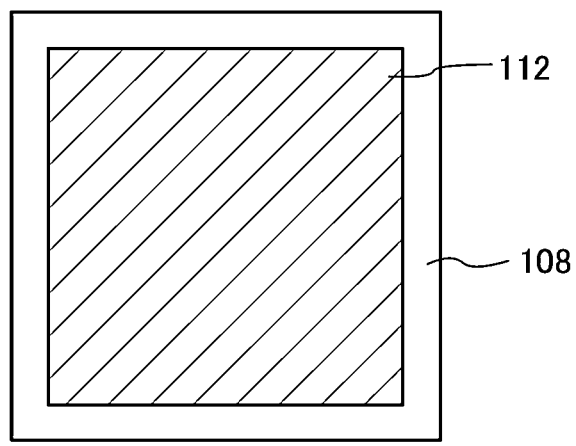
Figure 8C:
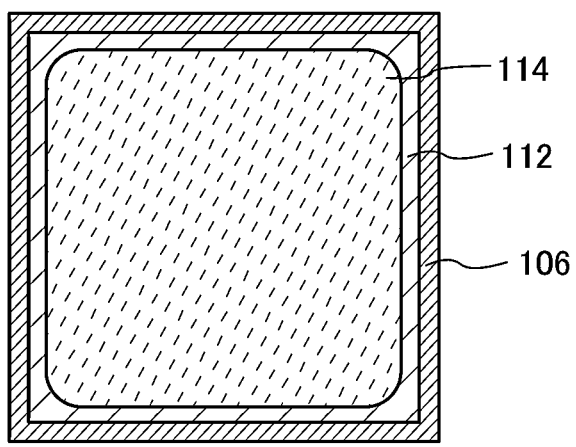

In the case of using the bond substrate 100 having a rectangular shape, the shape of the resist mask 114 may be formed to be a rectangular shape which is similar to the shape of the semiconductor film 112 and has an outermost edge inward than the semiconductor film 112 as illustrated in FIG. 8A. Then, the peripheral region may be removed and a rectangular shape may be formed so that outermost edges of the semiconductor film 112, the insulating film 102, and the insulating film 106 are inward than the semiconductor film 112 that is in a state before removal of the peripheral region. Alternatively, the shape of the resist mask 114 may be formed to be a rectangular shape with rounded four corners as illustrated in FIG. 8C and the semiconductor film 112, the insulating film 102, and the insulating film 106 may be formed to have a similar shape.

Figure 3B:
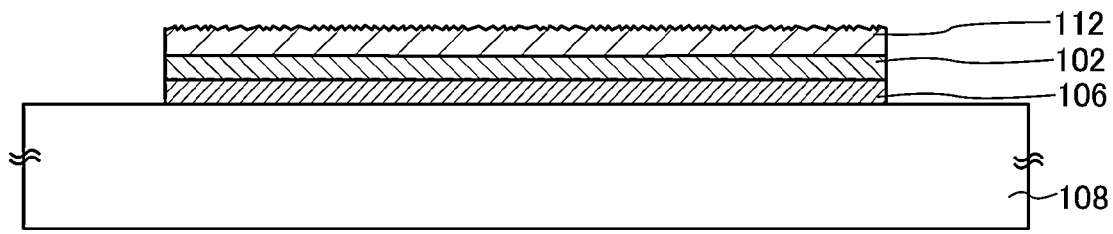

Next, using the resist mask 114, the peripheral region of the semiconductor film 112, the insulating film 102, and the insulating film 106 may be removed by etching as illustrated in FIG. 3B. The planar shape at this time is as illustrated in FIG. 8B. As the etching, dry etching or wet etching may be employed; however, the etching is preferably performed so as not to etch the glass substrate 108. The semiconductor film 112, the insulating film 102, and the insulating film 106 are preferably removed by dry etching using a fluorine-based gas, a chlorine-based gas, or the like.

The peripheral region of the semiconductor film 112, the insulating film 102, and the insulating film 106 is etched using, for example, a parallel-plate reactive ion etching (RIE) apparatus in the following manner. The semiconductor film 112 is etched for about 110 seconds under such conditions that the bias power of the parallel plate is 150 W, the pressure inside the chamber is 800 mTorr, a fluorine-based gas is used as an etching gas, and a gas flow rate is $SF_6$: He=28 sccm: 12 sccm. Then, the insulating film 102 and the insulating film 106 are etched for 2 minutes under such conditions that the bias power of the parallel plate is 300 W, the pressure inside the chamber is 200 mTorr, a fluorine-based gas is used as an etching gas, and a gas flow rate is $SF_6$: He=20 sccm: 20 sccm.

The above-described etching treatment is performed using the resist mask 114, so that the semiconductor film 112, the insulating film 102, and the insulating film 106 are formed to have a similar shape to the shape of the resist mask 114 and part of the glass substrate 108 is exposed. At this time, the peripheral region of the semiconductor film 112, the insulating film 102, and the insulating film 106, on which etching is performed, is preferably a band-like region from the outermost edge of the insulating film 106 to a place which is 1 mm to 10 mm inward than the outermost edge of the semiconductor film 112 that is in the state before the removal. For example, the region from the outermost edge of the insulating film 106 to a place which is about 6 mm inward than the outermost edge of the semiconductor film 112 that is in a state before removing the peripheral region may be etched. Here, it is preferable that the insulating film 106 exposed by formation of the semiconductor film 112 be also removed by the above-described etching treatment to expose part of the glass substrate 108. In the case where the insulating film 106 is not formed, the band-like region from the outermost edge of the semiconductor film 112 to a place which is 1 mm to 10 mm inward than the outermost edge of the semiconductor film 112 which is in a state before the removal is preferably etched as the peripheral region of the semiconductor film 112 and the insulating film 102.

The peripheral region of the semiconductor film 112, the insulating film 102, and the insulating film 106 is removed in the above-described manner, whereby a region where the bonding strength between the insulating film 106, and the semiconductor film 112 and the insulating film 102 is weak is removed. Thus, in the SOI substrate in which the semiconductor film 112, the insulating film 102, and the insulating film 106 are formed over the glass substrate 108, a possibility that the semiconductor film 112, the insulating film 102, and the insulating film 106 are peeled by stress applied by a conductive film is reduced in formation of the conductive film used for forming a gate electrode in manufacturing a TFT. Accordingly, a possibility of lowering yield due to peeling of the semiconductor film 112, the insulating film 102, and the insulating film 106 during manufacture of a semiconductor device can be reduced, and a semiconductor device which has high reliability sufficient for practical use can be manufactured.

Figure 3C:
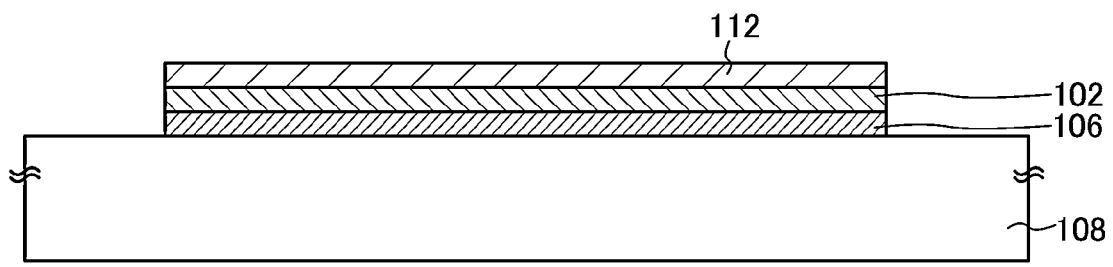

Next, as illustrated in FIG. 3C, a surface of the semiconductor film 112 may be planarized by polishing or the like. The planarization makes it possible to improve characteristics of the interface between the semiconductor film and a gate insulating film to be formed later. Specifically, polishing may be performed by CMP, liquid jet polishing, or the like. The thickness of the semiconductor film 112 is reduced by the above-described planarization.

Instead of polishing, etching may be performed on the surface of the semiconductor film 112 in order to planarize the surface of the semiconductor film 112. The etching may be performed using a dry etching method, for example, reactive ion etching (RIE), ICP (Inductively Coupled Plasma) etching, ECR (Electron Cyclotron Resonance) etching, parallel-plate (Capacitively Coupled Plasma) etching, magnetron plasma etching, dual-frequency plasma etching, helicon wave plasma etching, or the like.

The etching can not only thin the semiconductor film 112 to the film thickness optimum for a semiconductor element to be formed later but also planarize the surface of the semiconductor film 112.

The semiconductor film 112 formed over the glass substrate 108 includes crystal defects due to the formation of the embrittlement layer 104 and separation along the embrittlement layer 104. In addition, the planarity of the surface of the semiconductor film 112 is deteriorated. In order to reduce crystal defects and improve planarity, the semiconductor film 112 may be irradiated with a laser beam.

In the case where the surface of the semiconductor film 112 is planarized by dry etching before the laser irradiation, damages such as crystal defects might be generated on and near the surface of the semiconductor film 112 due to the dry etching. However, the aforementioned laser irradiation can recover even the damages caused by the dry etching.

Since the increase in temperature of the glass substrate 108 can be suppressed in this laser irradiation step, a substrate having low heat resistance such as a glass substrate can be used as the glass substrate 108. It is preferable that the semiconductor film 112 be partly melted by the laser irradiation. This is because if the semiconductor film 112 is completely melted, the recrystallization of the semiconductor film 112 is accompanied with disordered nucleation of the semiconductor film 112 in a liquid phase and crystallinity of the semiconductor film 112 is lowered. By partial melting, so-called longitudinal growth in which crystal growth proceeds from an unmelted solid portion occurs in the semiconductor film 112. Due to the recrystallization by the longitudinal growth, crystal defects of the semiconductor film 112 are reduced and crystallinity thereof is recovered. The state in which the semiconductor film 112 is completely melted indicates the state in which the semiconductor film 112 is melted to be in a liquid phase to the interface with the insulating film 102. On the other hand, the state in which the semiconductor film 112 is partially melted indicates that an upper part thereof is melted and is in a liquid phase and a lower part thereof is in a solid phase.

After the laser irradiation, the surface of the semiconductor film 112 may be etched. If the surface of the semiconductor film 112 is etched after the laser irradiation, the surface of the semiconductor film 112 is not necessarily etched before the laser irradiation. Moreover, if the surface of the semiconductor film 112 is etched before the laser irradiation, the surface of the semiconductor film 112 is not necessarily etched after the laser irradiation. In this embodiment, alternatively, the etching may be performed both before and after the laser irradiation.

The etching can not only thin the semiconductor film 112 to the film thickness optimum for a semiconductor element that is to be formed later but also planarize the surface of the semiconductor film 112.

After the laser irradiation, the semiconductor film 112 is preferably subjected to heat treatment at 500° C. to 700° C. inclusive. This heat treatment can eliminate defects of the semiconductor film 112 which have not been recovered by the laser irradiation and can reduce distortion of the semiconductor film 112. For the heat treatment, an RTA (rapid thermal anneal) apparatus, a resistance heating furnace, or a microwave heating apparatus can be used. As an RTA apparatus, a GRTA (gas rapid thermal anneal) apparatus or an LRTA (lamp rapid thermal anneal) apparatus can be used. For example, when a resistance heating furnace is used, heat treatment may be performed at 600° C. for 4 hours.

In this manner, an SOI substrate which is used for manufacturing a semiconductor device according to an embodiment of the present invention can be manufactured.

Next, a semiconductor device according to an embodiment of the present invention is manufactured using the above-described SOI substrate. A manufacturing method of an n-channel field-effect transistor and a p-channel field-effect transistor will be described with reference to FIGS. 4A to 4D, FIGS. 5A to 5C, and FIGS. 6A to 6C. Various kinds of semiconductor devices can be formed by combining a plurality of thin film transistors (TFTs).

First, a p-type impurity element such as boron, aluminum, or gallium or an n-type impurity element such as phosphorus or arsenic is preferably added to the semiconductor film 112 in accordance with a formation region of an n-channel field-effect transistor or a p-channel field-effect transistor. For example, a p-type impurity element is added to a formation region of an n-channel field-effect transistor and an n-type impurity element is added to a formation region of a p-channel field-effect transistor, whereby so-called well regions are formed. The dose of impurity ions may be approximately greater than or equal to $1\times10^{12}$ ions/cm$^2$ and less than or equal to $1\times10^{14}$ ions/cm$^2$. Furthermore, in the case of controlling the threshold voltage of the field-effect transistors, an n-type impurity element or a p-type impurity element may be added into these well regions.

Figure 4A:
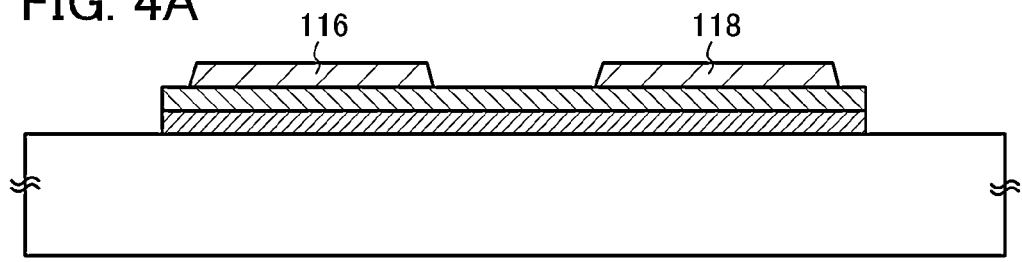
FIGS. 4A to 4D illustrate an example of a manufacturing method of a semiconductor device according to an embodiment of the present invention.

Next, the semiconductor film 112 is separated into each element by etching, so that a semiconductor film 116 and a semiconductor film 118 are formed as illustrated in FIG. 4A. In this embodiment, the semiconductor film 116 is used for forming the n-channel TFT and the semiconductor film 118 is used for forming the p-channel TFT.

Figure 4B:
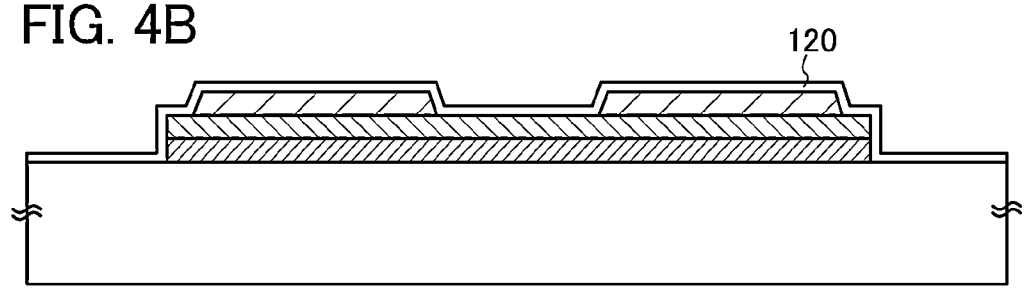

Then, as illustrated in FIG. 4B, a gate insulating film 120 is formed to cover the semiconductor film 116, the semiconductor film 118, the insulating film 102, and the glass substrate 108. The gate insulating film 120 is preferably formed by a plasma CVD method with a single-layer structure or a stacked structure including an insulating film containing silicon oxide, silicon oxynitride, silicon nitride oxide, silicon nitride, hafnium oxide, aluminum oxide, tantalum oxide, or the like.

As a manufacturing method other than a plasma CVD method, a sputtering method or a method in which the semiconductor film 116 and the semiconductor film 118 are oxidized or nitrided by high-density plasma treatment can be given. High-density plasma treatment is performed using, for example, a mixed gas of a rare gas such as helium, argon, krypton, or xenon; and a gas such as oxygen, nitrogen oxide (including nitrous oxide), ammonia, nitrogen, or hydrogen. In this case, by exciting plasma by introduction of microwaves, plasma with a low electron temperature and high density can be generated. A surface of a semiconductor layer is oxidized or nitrided with oxygen radicals (OH radicals may be included) or nitrogen radicals (NH radicals may be included) which are generated by such a high-density plasma, whereby an insulating layer is formed to have a thickness of greater than or equal to 1 nm and less than or equal to 20 nm, preferably greater than or equal to 2 nm and less than or equal to 10 nm so as to be in contact with the semiconductor layer. When the gate insulating film 120 is formed by oxidizing or nitriding the semiconductor film 116 and the semiconductor film 118 by high-density plasma treatment, the gate insulating film 120 is formed to cover only the semiconductor film 116 and the semiconductor film 118, which is different from FIG. 4B.

Since the oxidation or nitridation of the semiconductor layers using the high-density plasma treatment is a solid-phase reaction, the interface state density between the gate insulating film 120 and each of the semiconductor films 116 and 118 can be drastically reduced. Further, by directly oxidizing or nitriding the semiconductor layers using high-density plasma treatment, variation in thickness of the formed insulating layer can be suppressed. Since the semiconductor layers have crystallinity, even when surfaces of the semiconductor layers are oxidized by a solid-phase reaction using the high-density plasma treatment, nonuniform oxidation in a crystal grain boundary can be suppressed; thus, a gate insulating layer with favorable uniformity and a low interface state density can be formed. When an insulating film formed by high-density plasma treatment as described above is used for part of or the entire gate insulating film of a transistor, characteristic variation can be suppressed.

A more specific example of a manufacturing method of the insulating film using plasma treatment will be described. The surfaces of the semiconductor film 116 and the semiconductor film 118 are oxidized or nitrided in such a manner that nitrous oxide ($N_2O$) is diluted to be greater than or equal to 1 time and less than or equal to 3 times (the flow ratio) with argon (Ar) and a microwave power (2.45 GHz) of greater than or equal to 3 kW and less than or equal to 5 kW is applied under a pressure of greater than or equal to 10 Pa and less than or equal to 30 Pa. By this treatment, a lower layer of the gate insulating film 120 with a thickness of greater than or equal to 1 nm and less than or equal to 10 nm (preferably, greater than or equal to 2 nm and less than or equal to 6 nm) is formed. Further, a silicon oxynitride film is formed as an upper layer of the gate insulating film 120 by a vapor-phase growth method in such a manner that nitrous oxide ($N_2O$) and silane ($SiH_4$) are introduced and microwave power (2.45 GHz) of greater than or equal to 3 kW and less than or equal to 5 kW is applied under a pressure of greater than or equal to 10 Pa and less than or equal to 30 Pa. The gate insulating film 120 is formed by combining solid phase reaction and a vapor-phase growth method as described above, whereby the gate insulating film 120 with low interface state density and excellent dielectric strength can be formed. Note that the gate insulating film 120 in this case has a two-layer structure.

Alternatively, the gate insulating film 120 may be formed by thermally oxidizing the semiconductor film 116 and the semiconductor film 118. In the case of forming the gate insulating film 120 by such thermal oxidation, a base substrate with a comparatively high heat resistance is preferably used. In the case of forming the gate insulating film 120 by thermally oxidizing the semiconductor film 116 and the semiconductor film 118, the gate insulating film 120 is formed to cover only the semiconductor film 116 and the semiconductor film 118, which is different from FIG. 4B.

Since the gate insulating film 120 forms an interface with the semiconductor layer, the gate insulating film 120 is preferable formed so that a silicon oxide film or a silicon oxynitride film be an interface. This is because, if a film in which the amount of nitrogen is higher than that of oxygen such as a silicon nitride film or a silicon nitride oxide film is formed, problems of interface characteristics such as generation of trap levels might be caused.

Note that after the gate insulating film 120 including hydrogen is formed, hydrogen included in the gate insulating film 120 may be diffused in the semiconductor film 116 and the semiconductor film 118 by performing heat treatment at a temperature of greater than or equal to 350° C. and less than or equal to 450° C. In this case, the gate insulating film 120 may be formed by depositing silicon nitride or silicon nitride oxide by a plasma CVD method. In this case, the process temperature may be set at 350° C. or less. In this manner, hydrogen is supplied to the semiconductor films 116 and 118, whereby defects in the semiconductor films 116 and 118, at an interface between the gate insulating film 120 and the semiconductor film 116, and at an interface between the gate insulating film 120 and the semiconductor film 118 can be effectively reduced.

Figure 4C:
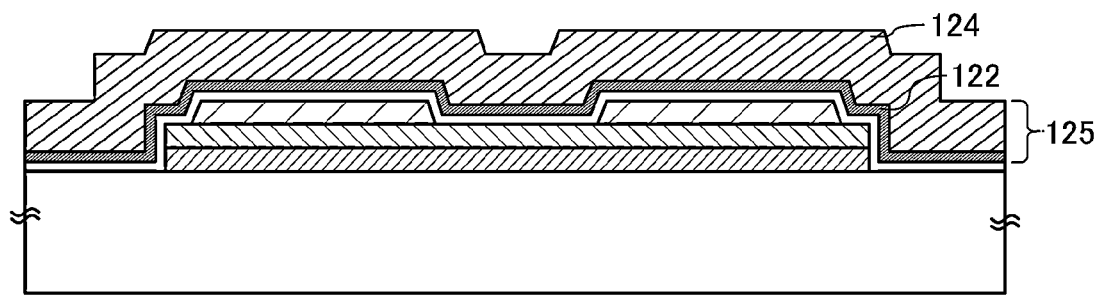

Next, as illustrated in FIG. 4C, a first conductive film 122 is formed to cover the gate insulating film 120, and a second conductive film 124 is further formed to cover the first conductive film 122; thus, a stacked conductive film 125 with a two-layer structure is formed. The first conductive film 122 and the second conductive film 124 form the stacked conductive film with a two-layer structure for forming gate electrodes. Here, the first conductive film 122 preferably has a compressive stress, and the second conductive film 124 preferably has a tensile stress whose value is equivalent to that of the compressive stress. Alternatively, the first conductive film 122 may have a tensile stress, and the second conductive film 124 may have a compressive stress whose value is equivalent to that of the tensile stress. It is preferable that the stacked conductive film 125 with a two-layer structure, in which the second conductive film 124 is formed over the first conductive film 122, have a stress of 0.1 GPa or lower.

As described above, stress is applied to the semiconductor film 116, the semiconductor film 118, the insulating film 102, and the insulating film 106, which are formed below the first conductive film 122 and the second conductive film 124, from the first conductive film 122 and the second conductive film 124. The peripheral region having weak bonding force with the insulating film 106, of the insulating film 102 and the semiconductor film 112, from which the semiconductor film 116 and the semiconductor film 118 are formed, is removed in the above-described step. However, in the case where the stress applied by the stacked conductive film 125 with a two-layer structure of the first conductive film 122 and the second conductive film 124 is high, there is still a possibility that the stacked conductive film 125, the semiconductor film 116, the semiconductor film 118, and the insulating film 102 may be peeled.

In view of this, the stress applied by the stacked conductive film 125 with a two-layer structure in which the second conductive film 124 is formed over the first conductive film 122 is preferably suppressed to a low stress of 0.1 GPa or lower. Therefore, in this embodiment, the first conductive film 122 and the second conductive film 124 have a compressive stress and a tensile stress respectively, so that the stress that the first conductive film 122 has is relieved by the stress that the second conductive film 124 has; thus, the stacked conductive film 125 with a two-layer structure has a low stress. Note that in this specification, "low stress" indicates a stress whose absolute value is close to zero, specifically a stress whose absolute value is 0.1 GPa or less. In addition, the stress in the state where no stress is applied is 0 GPa, the tensile stress is expressed with a positive sign, and the compressive stress is expressed with a negative sign.

Conditions for forming the stacked conductive film 125 with a two-layer structure of the first conductive film 122 and the second conductive film 124 so as to have a low stress will be described. In the case of forming the first conductive film 122 and the second conductive film 124 by a sputtering method, by adjusting electric power and pressure at the film formation, the stress of the stacked conductive film 125 with a two-layer structure of the first conductive film 122 and the second conductive film 124 can be adjusted. Generally, when the pressure is set higher and the electric power is set lower, the tensile stress can be made higher, and when the pressure is set lower and the electric power is set higher, the compressive stress can be made higher. Therefore, in the case where the first conductive film 122 has a compressive stress, the second conductive film 124 is formed under conditions of high pressure and low electric power, whereby the stacked conductive film 125 with a two-layer structure of the first conductive film 122 and the second conductive film 124 can be formed to have a low stress. Note that the film formation conditions depend on the material and thickness of the formed conductive film, the material and temperature of the substrate over which the film is formed, and the like; therefore, the above-described conditions do not always work.

For example, in the case where the stacked conductive film 125 having a low stress is formed using a tantalum nitride film as the first conductive film 122 and a tungsten film as the second conductive film 124, sputtering is performed under the following conditions. First, a tantalum nitride film with a thickness of 30 nm is formed using tantalum as a target, at a film formation power of 1 kW, a film formation pressure of 0.6 Pa, and a gas flow rate of Ar (argon): $N_2$ (nitrogen)=50 sccm: 10 sccm. Here, since the tantalum nitride film formed under the above-described conditions has a compressive stress, the tungsten film is formed to have a tensile stress. A tungsten film with a thickness of 370 nm is formed using tungsten as a target, at a film formation power of 4 kW, a film formation pressure of 2.0 Pa, a substrate temperature of 230° C., and a gas flow rate of argon of 100 sccm. Since the tungsten film formed under the above-described conditions has a tensile stress, the compressive stress the tantalum nitride film has is relieved; thus, the stacked conductive film 125 having a low stress can be formed.

The first conductive film 122 and the second conductive film 124 can be formed using a conductive material such as an element selected from tungsten, tantalum, titanium, molybdenum, aluminum, copper, chromium, niobium, and the like; an alloy material containing the element; a compound material containing the element; or a semiconductor material which is typified by polycrystalline silicon doped with an impurity element such as phosphorus. At that time, the conductive materials and the film formation conditions may be selected as appropriate in order that the stress of the second conductive film 124 relieves the stress of the first conductive film 122. The conductive materials as described above are formed by a sputtering method or a CVD method to form a stacked structure. The stacked structure of the conductive film is not limited to a two-layer structure and may be a structure including three or more layers. In this embodiment, the stacked conductive film 125 for forming gate electrodes is formed to have a two-layer structure of the first conductive film 122 and the second conductive film 124.

If the gate electrodes are formed to have a two-layer structure of the first conductive film 122 and the second conductive film 124 as in this embodiment, a stacked structure of a tantalum nitride layer and a tungsten layer, a stacked structure of a titanium nitride layer and a tungsten layer, or a stacked structure of a molybdenum nitride layer and a molybdenum layer can be formed, for example. The stacked structure of the tantalum nitride layer and the tungsten layer is preferably formed because etching rates of both layers are easily differentiated from each other and high selectivity can be obtained. Note that as for the exemplified stacked conductive film 125 having two layers, the first mentioned layer (e.g., a tantalum nitride layer) is preferably formed in contact with the gate insulating film 120. For example, the first conductive film 122 is formed with a thickness of 20 nm to 100 nm and the second conductive film 124 is formed with a thickness of 100 nm to 400 nm.

In this manner, the stacked conductive film 125 having the first conductive film 122 and the second conductive film 124 is formed as the conductive film for forming gate electrodes, and the stress that the first conductive film has can be relieved by the stress that the second conductive film has. Accordingly, the possibility that the semiconductor film 116, the semiconductor film 118, and the insulating film 102 formed below the first conductive film 122 and the second conductive film 124 may be peeled by the stress applied by the stacked conductive film 125 is reduced. In addition, a possibility that the stacked conductive film 125 may be peeled by its own stress is also reduced. Furthermore, by removal of the peripheral region of the semiconductor film 112, the insulating film 102, and the insulating film 106 as described above, the region where the bonding force between the insulating film 106, and the semiconductor film 112 and the insulating film 102 is weak is removed; therefore, a possibility that the semiconductor film 116, the semiconductor film 118, and the insulating film 102 are peeled by the stress of the stacked conductive film 125 is significantly reduced. Accordingly, reduction in yield due to peeling of the stacked conductive film 125, the semiconductor film 112, the insulating film 102, and the insulating film 106 during manufacture of a semiconductor device can be prevented, and a semiconductor device which has high reliability sufficient for practical use can be manufactured.

Next, a resist mask 126 and a resist mask 128 are selectively formed over the second conductive film 124. Then, first etching treatment and second etching treatment are performed on the first conductive film 122 and the second conductive film 124 using the resist mask 126 and the resist mask 128.

Figure 4D:
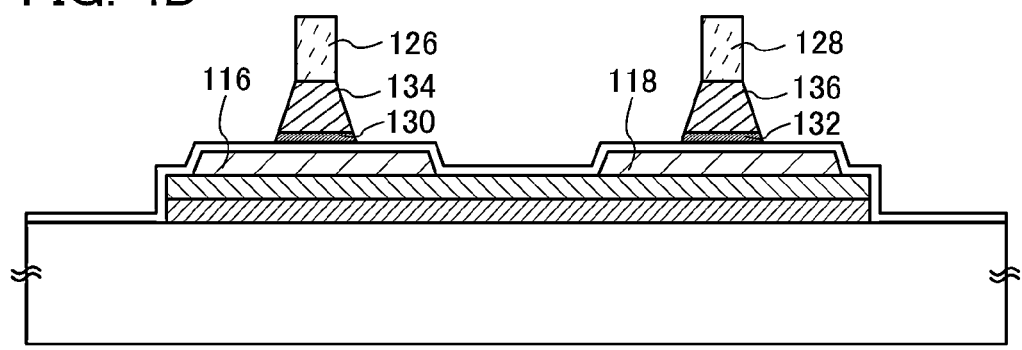

First, as illustrated in FIG. 4D, the first conductive film 122 and the second conductive film 124 are selectively etched by the first etching treatment using the resist mask 126 and the resist mask 128, whereby a first conductive film 130 and a second conductive film 134 are formed over the semiconductor film 116, and a first conductive film 132 and a second conductive film 136 are formed over the semiconductor film 118. The first etching treatment is performed so that the first conductive films 130 and 132 and the second conductive films 134 and 136 each have a tapered shape (slope).

Figure 5A:
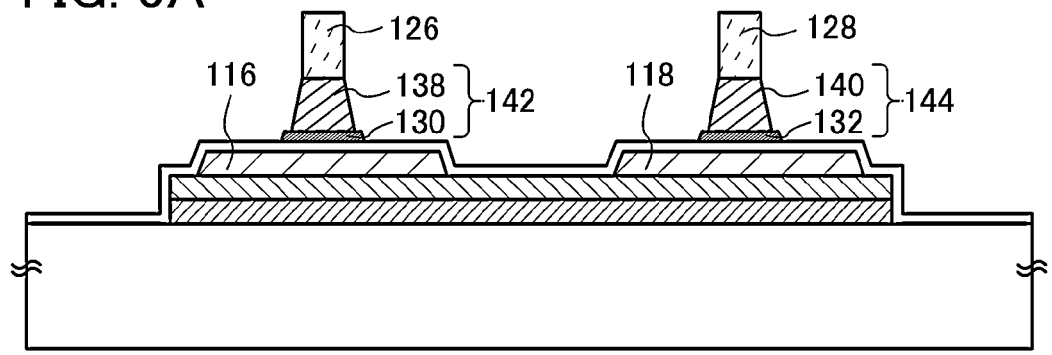
FIGS. 5A to 5C illustrate the example of the manufacturing method of the semiconductor device according to the embodiment of the present invention.

Next, as illustrated in FIG. 5A, the second conductive films 134 and 136 are selectively etched by the second etching treatment using the resist mask 126 and the resist mask 128, whereby a second conductive film 138 is formed over the semiconductor film 116 and a second conductive film 140 is formed over the semiconductor film 118. Anisotropic etching is performed in the second etching treatment so that the second conductive films 138 and 140 each have a taper angle of nearly 90°. Note that the second conductive film 138 is formed to have a width narrower than that of the first conductive film 130. In a similar manner, the second conductive film 140 is formed to have a width narrower than that of the first conductive film 132. Here, "width" indicates the length in a direction parallel to the direction in which carriers flow in a channel formation region (direction connecting a source region and a drain region). Thus, a gate electrode 142 with a two-layer structure of the first conductive film 130 and the second conductive film 138 and a gate electrode 144 with a two-layer structure of the first conductive film 132 and the second conductive film 140 are formed.

An etching method employed for the first etching treatment and the second etching treatment may be selected as appropriate. In order to increase etching rate, it is preferable to use a dry etching apparatus using a high-density plasma source such as an electron cyclotron resonance (ECR) source or an inductively coupled plasma (ICP) source. With appropriate control of the etching conditions (power applied to a coiled electrode, power applied to an electrode on the substrate side, the temperature of the electrode on the substrate side, and the like) of the first etching treatment and the second etching treatment, side surfaces of the first conductive films 130 and 132 and the second conductive films 138 and 140 can each have a desired tapered shape. After formation of the desired gate electrodes 142 and 144, the resist masks 126 and 128 may be removed.

Figure 5B:
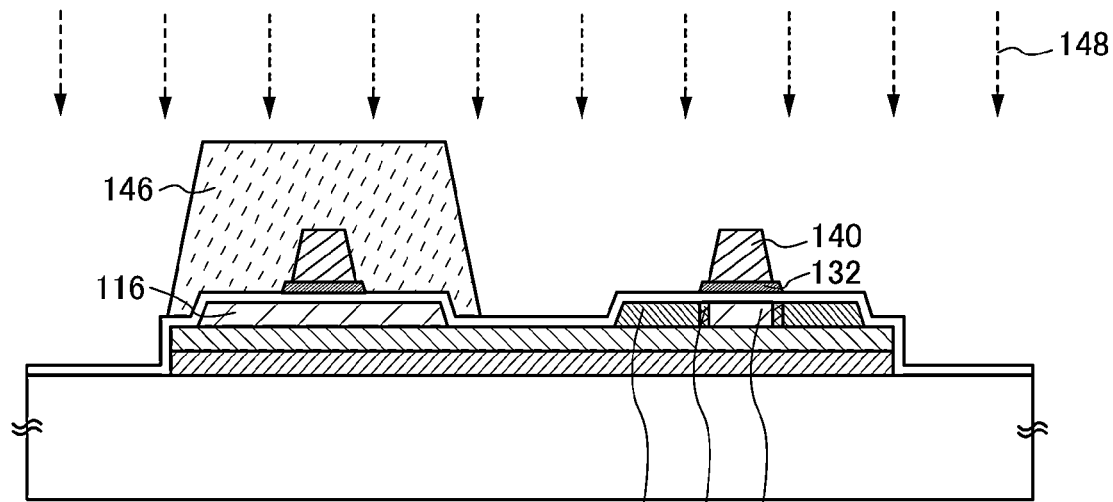

Next, a resist mask 146 is selectively formed so as to cover the semiconductor film 116 as illustrated in FIG. 5B. Then, using the resist mask 146 as a mask, a p-type impurity element 148 is added to the semiconductor film 118. The first conductive film 132 and the second conductive film 140, which are formed above the semiconductor film 118, serve as masks and a pair of high-concentration impurity regions 150, a pair of low-concentration impurity regions 152, and a channel formation region 154 are formed in the semiconductor film 118 in a self-aligned manner.

Here, in order to form a p-channel field-effect transistor, a p-type impurity element such as boron, aluminum, gallium, or the like is added as the p-type impurity element 148 to the semiconductor film 118. Boron is added as the p-type impurity element 148 here to form a p-channel field-effect transistor. Further, boron is made to be contained in the high-concentration impurity regions 150 at a concentration of approximately $1\times10^{20}$ atoms/cm$^3$ to $5\times10^{21}$ atoms/cm$^3$. The high-concentration impurity regions 150 function as source and drain regions.

The high-concentration impurity regions 150 are formed in regions of the semiconductor film 118 which do not overlap with the first conductive film 132, and the low-concentration impurity regions 152 are formed in regions of the semiconductor film 118 which overlap with the first conductive film 132 and do not overlap with the second conductive film 140. The channel formation region 154 is formed in a region overlapping with the second conductive film 140. The low-concentration impurity regions 152 have an impurity concentration lower than the high-concentration impurity regions 150.

Figure 5C:
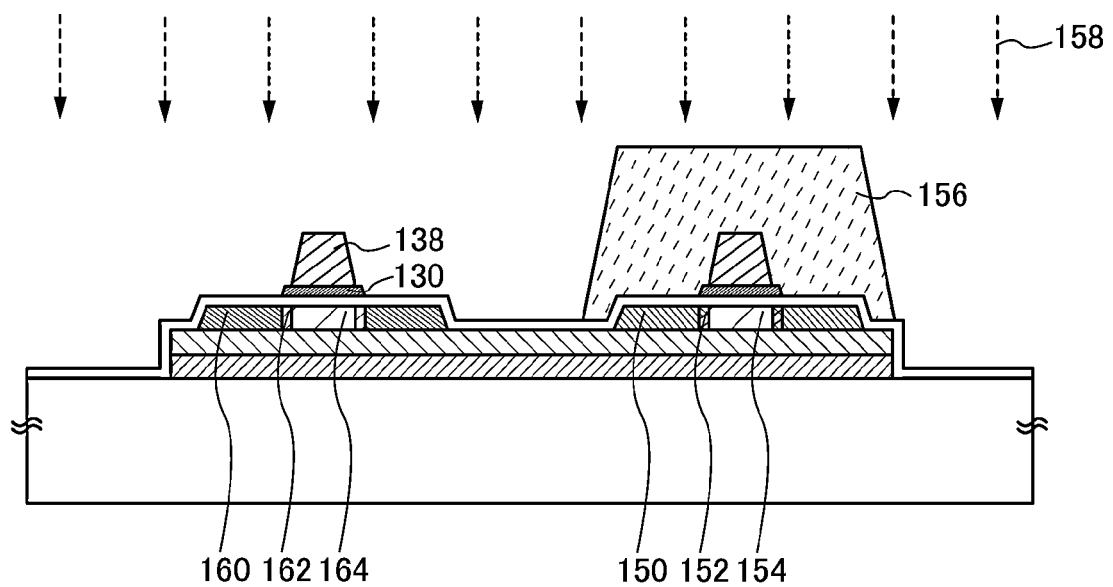

After the removal of the resist mask 146, a resist mask 156 is selectively formed so as to cover the semiconductor film 118 as illustrated in FIG. 5C. Then, using the resist mask 156 as a mask, an n-type impurity element 158 is added to the semiconductor film 116. The first conductive film 130 and the second conductive film 138, which are formed above the semiconductor film 116, serve as masks and a pair of high-concentration impurity regions 160, a pair of low-concentration impurity regions 162, and a channel formation region 164 are formed in the semiconductor film 116 in a self-aligned manner.

Here, in order to form an n-channel field-effect transistor, an n-type impurity element such as phosphorus, arsenic, or the like is added as the n-type impurity element 158 to the semiconductor film 116. For example, phosphorus is added as the n-type impurity element 158 so as to be contained in the high-concentration impurity regions 160 at a concentration of approximately $5\times10^{19}$ atoms/cm$^3$ to $5\times10^{20}$ atoms/cm$^3$. The high-concentration impurity regions 160 function as source and drain regions.

The high-concentration impurity regions 160 are formed in regions of the semiconductor film 116 which do not overlap with the first conductive film 130, and the low-concentration impurity regions 162 are formed in regions of the semiconductor film 116 which overlap with the first conductive film 130 and do not overlap with the second conductive film 138. The channel formation region 164 is formed in a region overlapping with the second conductive film 138. The low-concentration impurity regions 162 have an impurity concentration lower than the high-concentration impurity regions 160.

The order of forming the high-concentration impurity regions 150, the low-concentration impurity regions 152, and the channel formation region 154 in the semiconductor film 118 and forming the high-concentration impurity regions 160, the low-concentration impurity regions 162, and the channel formation region 164 in the semiconductor film 116 is not limited to this embodiment and may be changed as appropriate. After formation of the impurity regions (the high-concentration impurity regions 150, the low-concentration impurity regions 152, the high-concentration impurity regions 160, the low-concentration impurity regions 162) in the semiconductor films 116 and 118, it is preferable to perform heat treatment, laser beam irradiation, or the like as appropriate for activation (reduction in resistance).

Figure 6A:
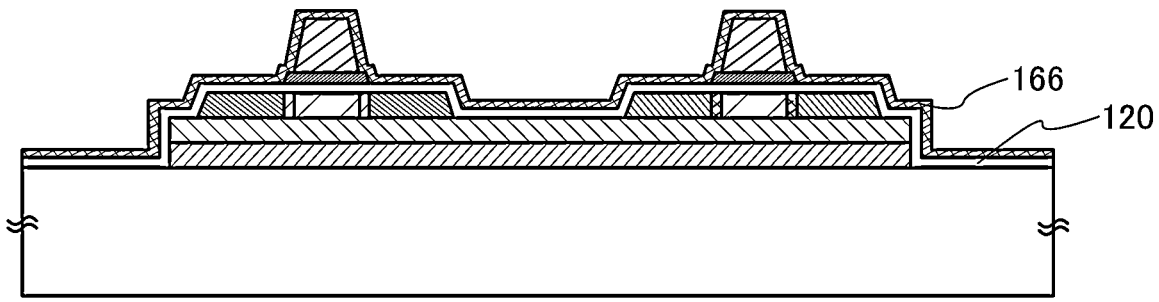
FIGS. 6A to 6C illustrate the example of the manufacturing method of the semiconductor device according to the embodiment of the present invention.

Next, an insulating film 166 is formed to cover the gate electrode 142, the gate electrode 144, and the gate insulating film 120 as illustrated in FIG. 6A. The insulating film 166 is formed by a CVD method or a sputtering method using a silicon oxide film, a silicon oxynitride film, a silicon nitride oxide film, a silicon nitride film, or the like. For example, a silicon oxynitride film (with a thickness of 50 nm) is formed by a plasma CVD method as the insulating film 166. Next, heat treatment is performed at a temperature which is higher than or equal to 400° C. and lower than or equal to the strain point of the supporting glass substrate 108, whereby the impurity regions (the high-concentration impurity regions 150, the low-concentration impurity regions 152, the high-concentration impurity regions 160, the low-concentration impurity regions 162) can be activated. For example, heat treatment is performed for 1 hour at 480° C. in a nitrogen atmosphere. Performing heat treatment after the formation of the insulating film 166 can prevent oxidation of the gate electrodes due to the heat treatment. Further, by controlling the atmosphere in the heat treatment, oxidation of the gate electrodes can be prevented without the formation of the insulating film 166.

Figure 6B:
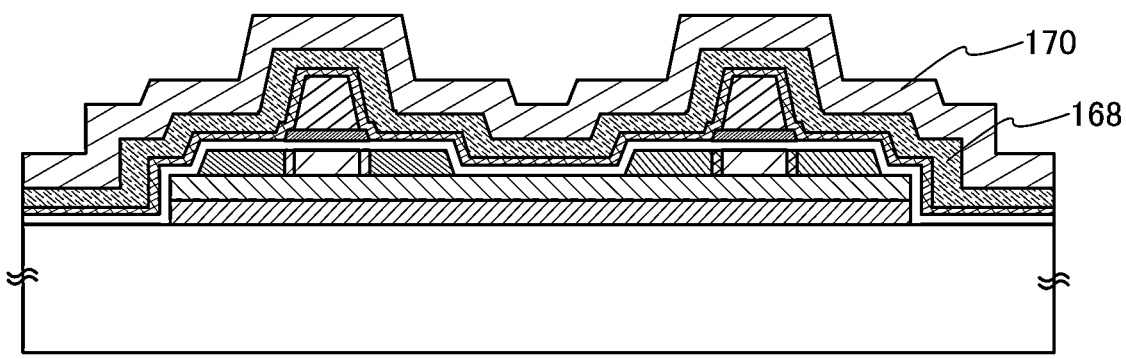

Then, a first interlayer insulating film 168 and a second interlayer insulating film 170 are formed over the insulating film 166 as illustrated in FIG. 6B. As the first interlayer insulating film 168 and the second interlayer insulating film 170, a silicon oxide layer, a silicon oxynitride layer, a silicon nitride layer, a silicon nitride oxide layer, or the like can be formed by a CVD method or a sputtering method. Alternatively, the interlayer insulating films can be formed by an application method such as a spin coating method, using an organic material such as polyimide, polyamide, polyvinylphenol, benzocyclobutene, acrylic, or epoxy, a siloxane material such as a siloxane resin, an oxazole resin, or the like. Note that the siloxane material corresponds to a material having Si—O—Si bonds.

It is preferable that at least one layer of an insulating film containing hydrogen be formed as the insulating film formed above the gate electrodes 142 and 144, and dangling bonds existing in the single crystal semiconductor films be terminated with the hydrogen by heat treatment. When heat treatment at a temperature of 350° C. or higher and 470° C. or lower, preferably 400° C. or higher and 450° C. or lower is performed after formation of the insulating film containing hydrogen, hydrogen contained in the insulating film is thermally excited by the heat treatment and diffused. Accordingly, the hydrogen passes through the insulating films and reaches the single crystal semiconductor films. Then, dangling bonds in the single crystal semiconductor films are terminated with the hydrogen. Since dangling bonds in a semiconductor layer, particularly in a channel formation region may adversely affect electric characteristics of a manufactured transistor, hydrogen termination as in this embodiment is effective. Hydrogen termination can improve interface characteristics between the gate insulating film and the single crystal semiconductor films.

The insulating film containing hydrogen can be formed by a plasma CVD method using a process gas which contains hydrogen. Even when the insulating film containing hydrogen is not formed, heat treatment performed in an atmosphere containing hydrogen enables termination of dangling bonds in the single crystal semiconductor films with hydrogen. For example, an insulating film containing hydrogen is formed as the first interlayer insulating film 168 and the second interlayer insulating film 170 is formed thereover, and then heat treatment for hydrogen termination is performed. In this case, the second interlayer insulating film 170 is formed under such conditions as not to dehydrogenate the first interlayer insulating film 168.

For example, a silicon nitride oxide film (with a thickness of 300 nm) as the first interlayer insulating film 168 and a silicon oxynitride film (with a thickness of 450 nm) as the second interlayer insulating film 170 are successively formed by a plasma CVD method. As a process gas for forming the silicon nitride oxide film, monosilane, ammonia, hydrogen, and nitrogen oxide are used. As a process gas for forming the silicon oxynitride film, monosilane and nitrogen oxide are used. When the process temperature is approximately 200° C. to 300° C., the insulating film can be formed without dehydrogenation of the silicon nitride oxide film. Then, after formation of the second interlayer insulating film 170, heat treatment is performed at 410° C. in a nitrogen atmosphere for one hour, thereby terminating the single crystal semiconductor films with hydrogen.

Figure 6C:
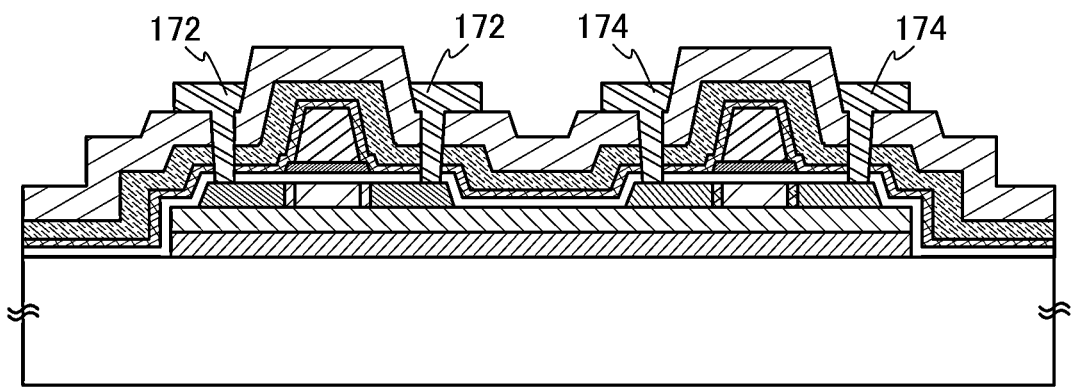

Next, as illustrated in FIG. 6C, contact holes are formed in the second interlayer insulating film 170, the first interlayer insulating film 168, the insulating film 166, and the gate insulating film 120, and wirings 172 and wirings 174 are formed so as to fill the contact holes. Here, a pair of contact holes reaching the pair of high-concentration impurity regions 160 is formed, and a pair of wirings 172 reaching the high-concentration impurity regions 160 through the contact holes is formed. At the same time, a pair of contact holes reaching the pair of high-concentration impurity regions 150 is formed, and a pair of wirings 174 reaching the high-concentration impurity regions 150 through the contact holes is formed. The wirings 172 and the wirings 174 function as source and drain electrodes. The wirings 172 are electrically connected to the high-concentration impurity regions 160. The wirings 174 are electrically connected to the high-concentration impurity regions 150.

The wirings 172 and the wirings 174 are formed using an element selected from aluminum, tungsten, titanium, tantalum, molybdenum, nickel, neodymium, copper, or the like, or an alloy material or compound material which contains any of these elements. As the alloy material containing any of the elements, an aluminum alloy containing titanium, an aluminum alloy containing neodymium, an aluminum alloy containing silicon (also referred to as aluminum silicon), and the like can be given. As the compound material containing any of the elements, a nitride such as tungsten nitride, titanium nitride, tantalum nitride, and the like can be given. The wirings 172 and the wirings 174 may be formed over the entire surface by using the aforementioned material by a sputtering method or a CVD method and then may be formed into a desired shape by selective etching. Further, the wirings 172 and the wirings 174 can be formed with a single-layer structure or a stacked structure including two or more layers. For example, a structure in which a titanium layer, a titanium nitride layer, an aluminum layer, and a titanium layer are sequentially stacked can be employed. By forming an aluminum layer between titanium layers, heat resistance can be increased. Further, a titanium nitride layer between a titanium layer and an aluminum layer can function as a barrier layer.

Through the above-described process, a semiconductor device having the n-channel TFT and the p-channel TFT can be manufactured using the SOI substrate having a single crystal semiconductor film.

As described in this embodiment, the peripheral region of the semiconductor film 112, the insulating film 102, and the insulating film 106 is removed, and the stacked conductive film 125 formed of the first conductive film 122 having a compressive stress and the second conductive film 124 having a tensile stress is formed as the conductive film for forming the gate electrode 142 and the gate electrode 144. Thus, the stacked conductive film 125, the semiconductor film 112, the insulating film 102, and the insulating film 106 can be prevented from being peeled by stress applied by the stacked conductive film 125, and formation of a wiring pattern is not disturbed by particles of the peeled conductive film, insulating film, and semiconductor film. Accordingly, a possibility of lowering yield due to peeling of the semiconductor film 112, the insulating film 102, and the insulating film 106 during manufacture of a semiconductor device can be reduced, and a semiconductor device which has high reliability sufficient for practical use can be manufactured.

Note that the wirings 172 and the wirings 174 can be electrically connected to each other so that the n-channel field-effect transistor and the p-channel field-effect transistor can be electrically connected to each other, thereby forming a CMOS transistor.

By combining a plurality of transistors described in this embodiment, an embodiment of the present invention can be applied to manufacture any kind of semiconductor devices with various functions including microprocessors, integrated circuits such as image processing circuits, RF tags for transmitting and receiving data with an interrogator without contact, semiconductor display devices, and the like. The semiconductor display devices include the following in its category: liquid crystal display devices, light-emitting devices in which a light-emitting element typified by an organic light-emitting element (OLED) is provided for each pixel, DMDs (digital micromirror devices), PDPs (plasma display panels), FEDs (field emission displays), and other semiconductor display devices in which a circuit element using a semiconductor film is included in a driver circuit. Note that the structure of the transistors described in this embodiment is an example, and the structure is not limited to the structure illustrated in the drawings.

Note that the structure described in this embodiment can be combined with any of the structures described in other embodiments as appropriate.

Embodiment 2

In Embodiment 2, a manufacturing method of a semiconductor device in which sidewalls are formed differently from Embodiment 1 to form high-concentration impurity regions, low-concentration impurity regions, and a channel formation region in a semiconductor film will be described with reference to FIGS. 7A to 7D.

First, in a similar manner to that of Embodiment 1, the insulating film 106, the insulating film 102, the semiconductor film 116, and the semiconductor film 118 are formed over the glass substrate 108 and they are covered with the gate insulating film 120, the first conductive film 122, and the second conductive film 124 as illustrated in FIG. 4C.

Next, the resist mask 126 and the resist mask 128 are selectively formed over the second conductive film 124. Then, the first conductive film 122 and the second conductive film 124 are etched using the resist mask 126 and the resist mask 128. Accordingly, a gate electrode 208 with a two-layer structure formed of a first conductive film 200 and a second conductive film 204 is formed over the semiconductor film 116, and a gate electrode 210 with a two-layer structure formed of a first conductive film 202 and a second conductive film 206 is formed over the semiconductor film 118. At this time, it is preferable that the gate electrode 208 and the gate electrode 210 do not have tapered shapes, which is different from Embodiment 1.

Figure 7A:
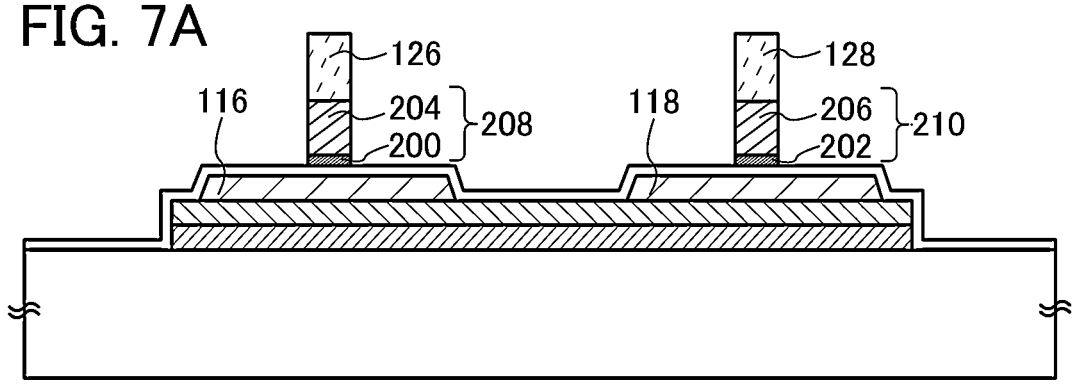
FIGS. 7A to 7D illustrate an example of a manufacturing method of a semiconductor device according to an embodiment of the present invention.
Figure 7B:
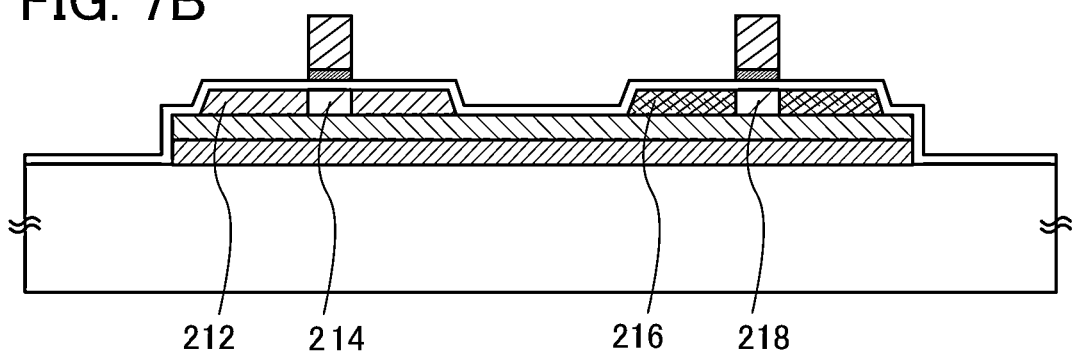

Then, as illustrated in FIG. 7B, impurity elements each imparting one conductivity type are added to the semiconductor film 116 and the semiconductor film 118 using the gate electrode 208 and the gate electrode 210 as masks. Here, in order to form a p-channel field-effect transistor, a p-type impurity element such as boron, aluminum, gallium, or the like is added as the p-type impurity element to the semiconductor film 118. In addition, in order to form an n-channel field-effect transistor, an n-type impurity element such as phosphorus, arsenic, or the like is added as the n-type impurity element to the semiconductor film 116. Note that when the impurity element imparting p-type conductivity is added to the semiconductor film 118, the semiconductor film 116 to which the n-type impurity element is added is covered with a mask or the like so that the impurity element imparting p-type conductivity is added selectively. Further, when the impurity element imparting n-type conductivity is added to the semiconductor film 116, the semiconductor film 118 to which the p-type impurity element is added is covered with a mask or the like so that the impurity element imparting n-type conductivity is added selectively. Alternatively, after an impurity element imparting one of the p-type conductivity and the n-type conductivity is added to the semiconductor films 116 and 118, an impurity element imparting the other conductivity may be selectively added to one of the semiconductor films 116 and 118 at a higher concentration than that of the previously added impurity element. By the above-described addition of impurity elements, low-concentration impurity regions 212 and a channel formation region 214 are formed in the semiconductor film 116 and low-concentration impurity regions 216 and a channel formation region 218 are formed in the semiconductor film 118 in a self-aligned manner.

Figure 7C:
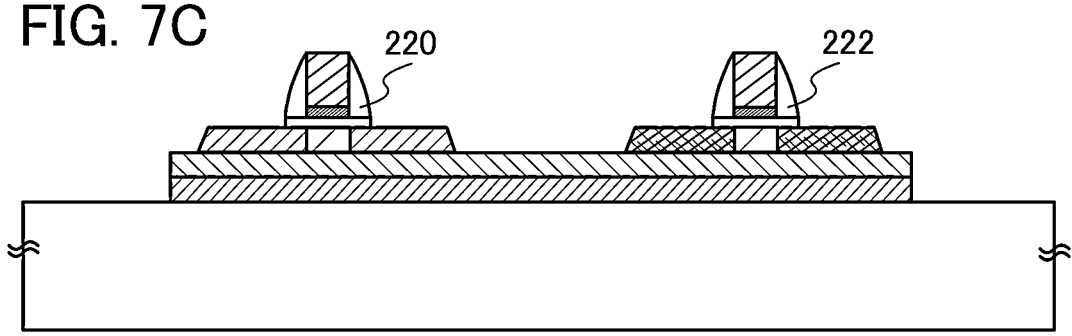

Next, as illustrated in FIG. 7C, sidewalls 220 are formed on side surfaces of the gate electrode 208, and sidewalls 222 are formed on side surfaces of the gate electrode 210. For example, the sidewalls 220 and the sidewalls 222 can be formed in such a manner that an insulating film is newly formed so as to cover the gate insulating film 120 and the gate electrodes 208 and 210 and the insulating film is partially etched by anisotropic etching in which etching is performed mainly in a perpendicular direction. By the anisotropic etching, the newly formed insulating film is partially etched, so that the sidewalls 220 are formed on the side surfaces of the gate electrode 208 and the sidewalls 222 are formed on the side surfaces of the gate electrode 210. Note that the gate insulating film 120 may be partially etched by the above-described anisotropic etching. The insulating film for forming the sidewalls 220 and the sidewalls 222 can be formed of a single layer or a stack of layers of a silicon film, a silicon oxide film, a silicon nitride oxide film, a silicon oxynitride film, or a film including an organic material such as an organic resin by a plasma CVD method, a sputtering method, or the like. In this embodiment, a 100-nm-thick silicon oxide film is formed by a plasma CVD method. In addition, as an etching gas, a mixed gas of $CHF_3$ and He can be used. Note that the process for forming the sidewalls 220 and 222 is not limited to these steps.

Figure 7D:
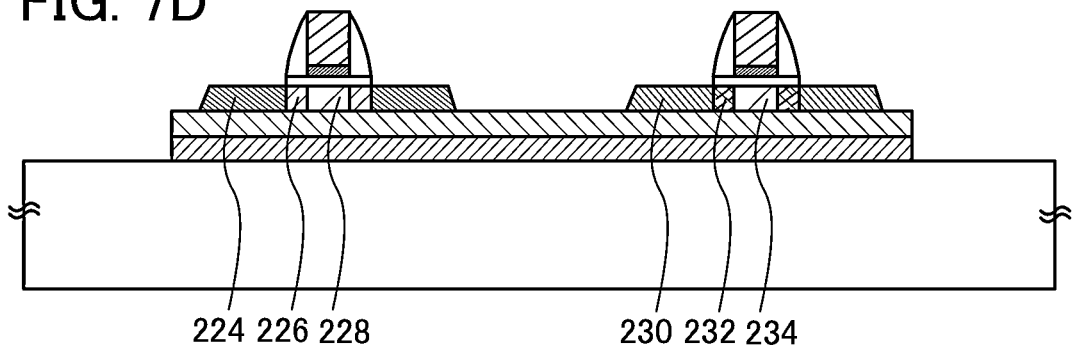

Next, as illustrated in FIG. 7D, impurity elements each imparting one conductivity type are added to the semiconductor film 116 and the semiconductor film 118 with the use of the gate electrode 208, the gate electrode 210, the sidewalls 220, and the sidewalls 222 as masks. It is to be noted that the impurity elements imparting the same conductivity type as the impurity elements which have been added to the semiconductor films 116 and 118 in the previous step are added to the semiconductor films 116 and 118 at higher concentration than in the previous step. Note that when the impurity element imparting p-type conductivity is added to the semiconductor film 118, the semiconductor film 116 to which the n-type impurity element is added is covered with a mask or the like so that the impurity element imparting p-type conductivity is added selectively. Further, when the impurity element imparting n-type conductivity is added to the semiconductor film 116, the semiconductor film 118 to which the p-type impurity element is added is covered with a mask or the like so that the impurity element imparting n-type conductivity is added selectively.

By the above-described addition of impurity element, a pair of high-concentration impurity regions 224, a pair of low-concentration impurity regions 226, and a channel formation region 228 are formed in the semiconductor film 116 in a self-aligned manner. Further, by the above-described addition of impurity element, a pair of high-concentration impurity regions 230, a pair of low-concentration impurity regions 232, and a channel formation region 234 are formed in the semiconductor film 118 in a self-aligned manner. The high-concentration impurity regions 224 and 230 function as source and drain regions, and the low-concentration impurity regions 226 and 232 function as lightly doped drain (LDD) regions.

In a similarly manner to Embodiment 1, the peripheral region of the semiconductor film 112, the insulating film 102, and the insulating film 106 is removed, and the stacked conductive film 125 formed of the first conductive film 122 having a compressive stress and the second conductive film 124 having a tensile stress is formed as the conductive film for forming the gate electrode 208 and the gate electrode 210. Thus, the stacked conductive film 125, the semiconductor film 112, the insulating film 102, and the insulating film 106 can be prevented from being peeled by stress applied by the stacked conductive film 125, and formation of a wiring pattern is not disturbed by particles of the peeled conductive film, insulating film, and semiconductor film. Accordingly, a possibility of lowering yield due to peeling of the semiconductor film 112, the insulating film 102, and the insulating film 106 during manufacture of a semiconductor device can be reduced, and a semiconductor device which has high reliability sufficient for practical use can be manufactured.

The following process can be performed with reference to Embodiment 1; thus, a semiconductor device can be manufactured.

Embodiment 3

Figure 9:
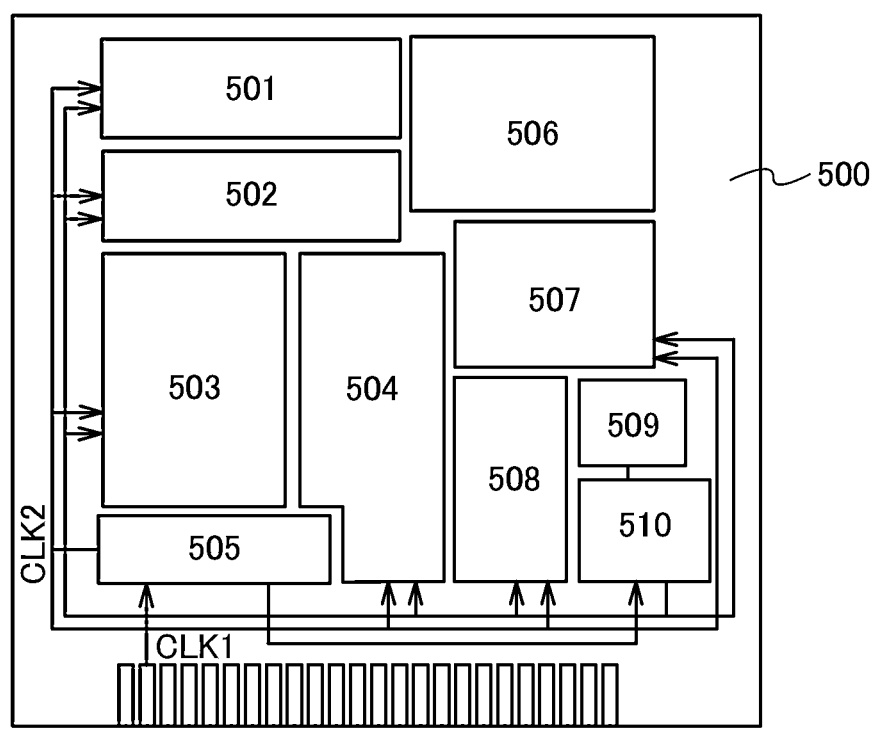
FIG. 9 illustrates an example of a semiconductor device according to an embodiment of the present invention.

In Embodiment 3, a specific mode of a semiconductor device manufactured by application of an embodiment of the present invention will be described with reference to FIG. 9 and FIG. 10.

First, a microprocessor will be described as an example of a semiconductor device. FIG. 9 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory (ROM) 509, and a ROM interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 judges an interrupt request from an external input and output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 9, the internal clock signal CLK2 is input to another circuit.

Next, an example of a semiconductor device having a function of transmitting and receiving data wirelessly and also having an arithmetic function will be described. FIG. 10 is a block diagram illustrating a structural example of a semiconductor device. The semiconductor device illustrated in FIG. 10 can be referred to as a computer (hereinafter referred to as an "RFCPU") which operates by transmitting and receiving signals to and from an external device by wireless communication.

Figure 10:
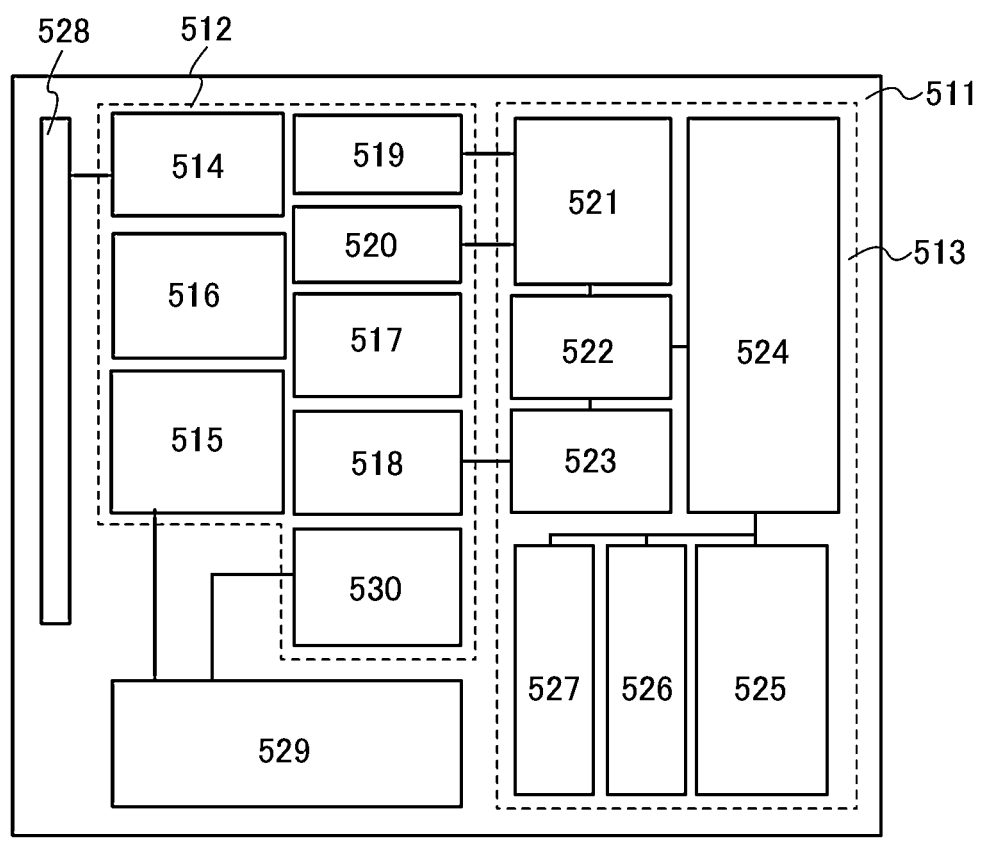
FIG. 10 illustrates an example of a semiconductor device according to an embodiment of the present invention.

As illustrated in FIG. 10, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit (CPU) 525, a random access memory (RAM) 526, and a read only memory (ROM) 527.

The operation of the RFCPU 511 is roughly described below. The resonance circuit 514 generates induced electromotive force based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a different component.

The reset circuit 517 generates a signal that resets and initializes the digital circuit portion 513. For example, the reset circuit generates a signal which rises with delay after increase in power supply voltage as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and duty ratio of a clock signal in accordance with the power supply voltage or a consumption current of the central processing unit (CPU) 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory (ROM) 527, writing of data to the random access memory (RAM) 526, an arithmetic instruction to the central processing unit (CPU) 525, and the like.

The central processing unit (CPU) 525 accesses the read only memory (ROM) 527, the random access memory (RAM) 526, and the control register 522 via the CPU interface 524. The CPU interface 524 has a function of generating an access signal for any of the read only memory (ROM) 527, the random access memory (RAM) 526, and the control register 522 based on an address requested by the central processing unit (CPU) 525.

As an arithmetic method of the central processing unit (CPU) 525, a method may be employed in which the read only memory (ROM) 527 stores an operating system (OS) and a program is read at the time of starting operation and executed. Alternatively, a method in which a circuit dedicated to arithmetic is formed and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit (CPU) 525 using a program.

In a manufacturing process of a semiconductor device which is used in a microprocessor and an RFCPU of this embodiment, a peripheral region of a semiconductor film and an insulating film formed over a glass substrate is removed, and a stacked conductive film having a low stress is used as a conductive film for forming a gate electrode. Accordingly, peeling of the semiconductor film and the insulating film due to stress that the stacked conductive film has can be prevented. Therefore, a semiconductor device which has high reliability sufficient for practical use can be manufactured. Furthermore, reduction in yield due to peeling of the semiconductor film and the insulating film during manufacture of a semiconductor device can be prevented.

Note that the structure described in this embodiment can be combined with any of the structures described in other embodiments as appropriate.

Embodiment 4

In Embodiment 4, a display device manufactured by application of any of the semiconductor devices described in the above embodiments will be described with reference to FIGS. 11A and 11B and FIGS. 12A and 12B.

Figure 11A:
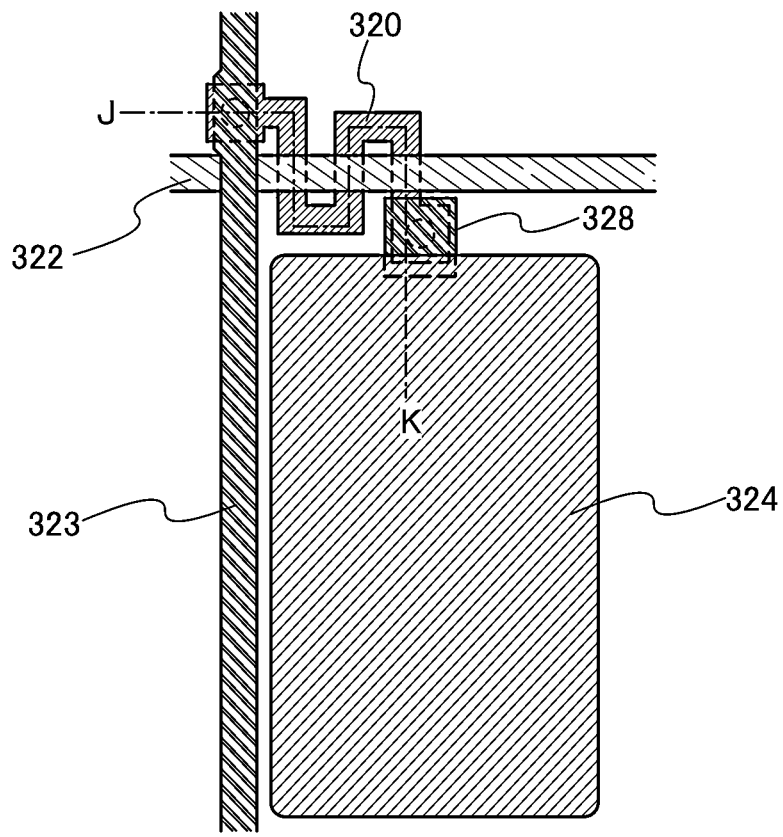
FIGS. 11A and 11B illustrate an example of a display device including a semiconductor device according to an embodiment of the present invention.
Figure 11B:
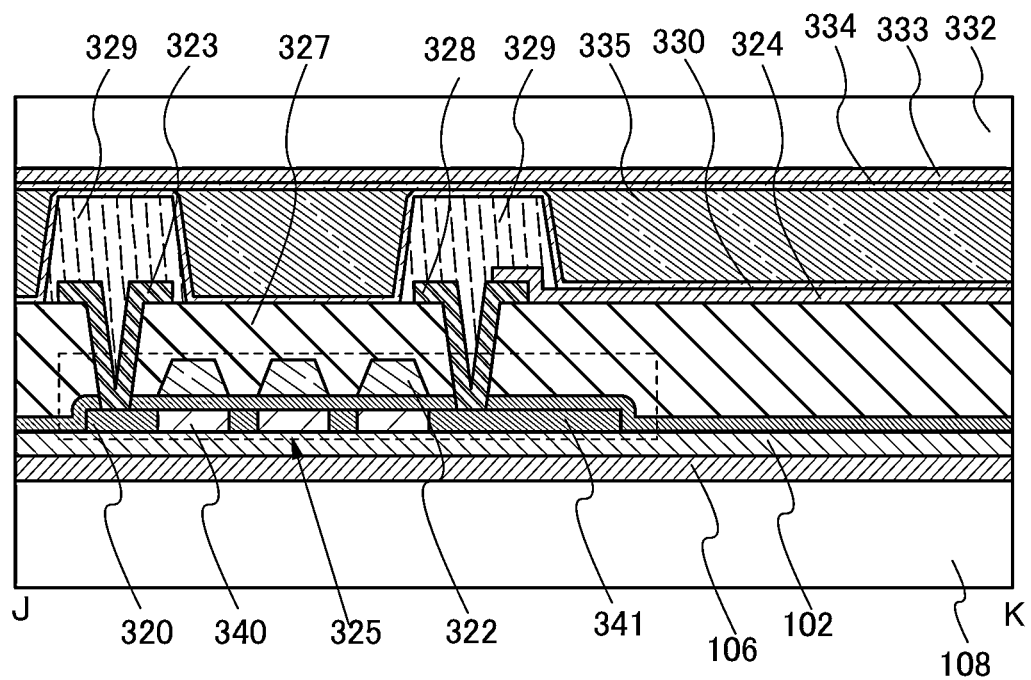

First, a liquid crystal display device will be described with reference to FIGS. 11A and 11B. FIG. 11A is a plan view of a pixel of the liquid crystal display device and FIG. 11B is a cross-sectional view taken along line J-K in FIG. 11A.

As illustrated in FIG. 11A, a pixel includes a single crystal semiconductor film 320, a scanning line 322 intersecting with the single crystal semiconductor film 320, a signal line 323 intersecting with the scanning line 322, a pixel electrode 324, and an electrode 328 which electrically connects the pixel electrode 324 to the single crystal semiconductor film 320. The single crystal semiconductor film 320 is a layer formed using a single crystal semiconductor film provided over the glass substrate 108 and is included in a TFT 325 of the pixel.

As an SOI substrate, the SOI substrate described in the above embodiment is used. As illustrated in FIG. 11B, the single crystal semiconductor film 320 is stacked over the glass substrate 108 with the second insulating film 106 and the first insulating film 102 interposed therebetween. The single crystal semiconductor film 320 of the TFT 325 is a film formed by dividing the single crystal semiconductor film of the SOI substrate for each element by etching. Channel formation regions 340 and n-type high-concentration impurity regions 341 to which an impurity element is added are formed in the single crystal semiconductor film 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over an interlayer insulating film 327. Over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed to keep the distance between the glass substrate 108 and the counter substrate 332. A liquid crystal layer 335 is formed in the space formed by the columnar spacers 329. The interlayer insulating film 327 has a step at the connection portion between the high-concentration impurity regions 341 and each of the signal line 323 and the electrode 328 due to formation of contact holes; therefore, orientation of liquid crystals in the liquid crystal layer 335 is easily disordered at this connection portion. Therefore, the columnar spacers 329 are formed at these step portions to prevent disorder of liquid crystal orientation.

Figure 12A:
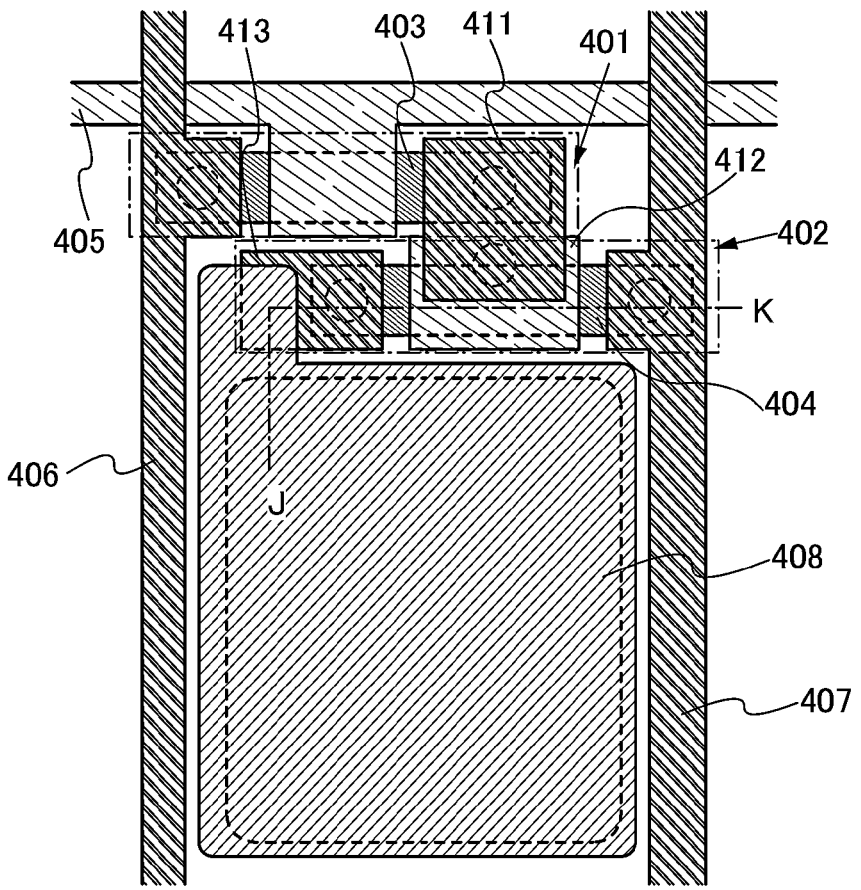
FIGS. 12A and 12B illustrate an example of a display device including a semiconductor device according to an embodiment of the present invention.
Figure 12B:
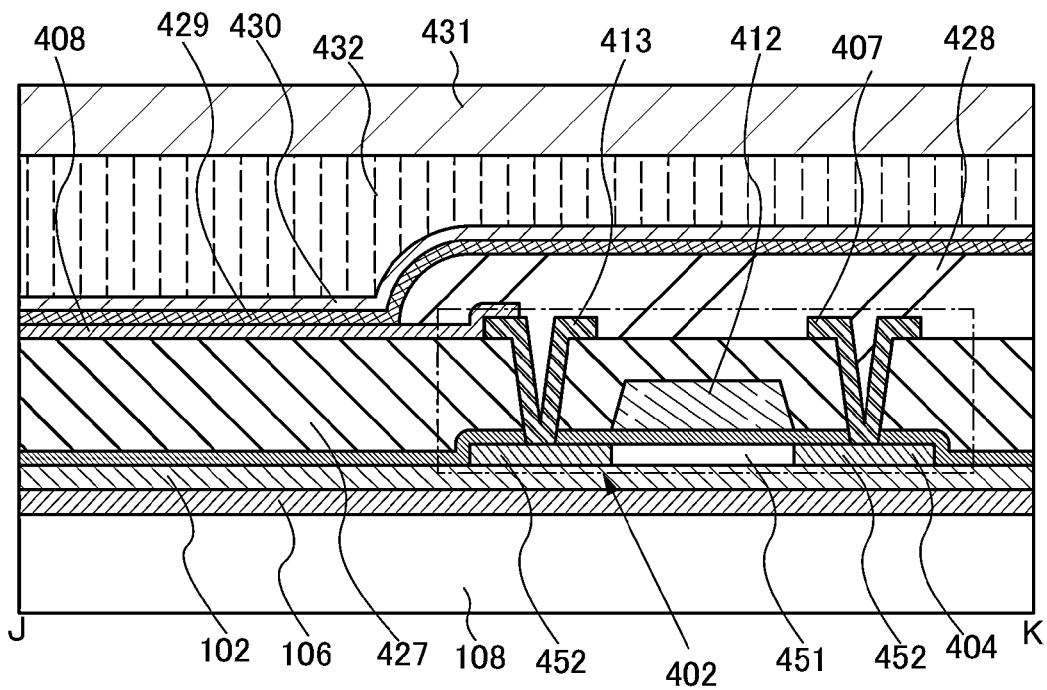

Next, an electroluminescent display device (hereinafter referred to as an EL display device) will be described with reference to FIGS. 12A and 12B. FIG. 12A is a plan view of a pixel of the EL display device, and FIG. 12B is a cross-sectional view taken along line J-K in FIG. 12A.

As illustrated in FIG. 12A, the pixel includes a selection transistor 401 and a display control transistor 402, which are TFTs, a scan line 405, a signal line 406, a current supply line 407, and a pixel electrode 408. Each pixel is provided with a light-emitting element having a structure in which a layer including an electroluminescent material (this layer is also referred to as an EL layer) is sandwiched between a pair of electrodes. One of the electrodes of the light-emitting element is the pixel electrode 408. Further, in a semiconductor film 403, a channel formation region, a source region, and a drain region of the selection transistor 401 are formed. Further, in a semiconductor film 404, a channel formation region, a source region, and a drain region of the display control transistor 402 are formed. The semiconductor films 403 and 404 are layers formed of the single crystal semiconductor film provided over the base substrate.

In the selection transistor 401, a gate electrode is included in the scanning line 405, one of a source electrode and a drain electrode is included in the signal line 406, and the other thereof is formed as an electrode 410. In the display control transistor 402, a gate electrode 412 is electrically connected to an electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 12B, a channel formation region 451 and p-type high-concentration impurity regions 452 are formed in the semiconductor film 404. As an SOI substrate, the SOI substrate manufactured in the above-described embodiment is used.

An interlayer insulating film 427 is formed to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate and is fixed to the glass substrate 108 by a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is difficult to employ the current driving method; in order to employ the current driving method in such a case, a correction circuit which corrects characteristic variation is needed. When the EL display device is manufactured by a manufacturing method including a manufacturing process of an SOI substrate and a gettering step, the selection transistor 401 and the display control transistor 402 do not have variation in electrical characteristics from pixel to pixel. Accordingly, the current driving method can be employed.

In a manufacturing process of a semiconductor device of this embodiment which is used in a liquid crystal display device and an EL display device, a peripheral region of a semiconductor film and an insulating film formed over a glass substrate is removed, and a stacked conductive film having a low stress is used as a conductive film for forming a gate electrode. Accordingly, peeling of the semiconductor film and the insulating film due to stress that the stacked conductive film has can be prevented. Therefore, a semiconductor device which has high reliability sufficient for practical use can be manufactured. Furthermore, reduction in yield due to peeling of the semiconductor film and the insulating film during manufacture of a semiconductor device can be prevented.

Note that the structure described in this embodiment can be combined with any of the structures described in other embodiments as appropriate.

Embodiment 5

In Embodiment 5, electronic devices manufactured by applying the semiconductor device described in any of the above embodiments will be described with reference to FIGS. 13A to 13C and FIGS. 14A to 14C.

Various electronic devices can be manufactured with the use of SOI substrates. The electronic devices include, in its category, televisions, cameras such as video cameras and digital cameras, goggle-type displays (head mounted displays), navigation systems, audio reproducing devices (such as car audio systems or audio components), computers, laptop type computers, game machines, portable information terminals (such as mobile computers, mobile phones, portable game machines, and e-book readers), and image reproducing devices having storage media (specifically, devices provided with display devices capable of playing audio data stored in recording media such as digital versatile disk (DVD) and displaying stored image data). Examples thereof are illustrated in FIGS. 13A to 13C and FIGS. 14A to 14C.

Figure 13A:
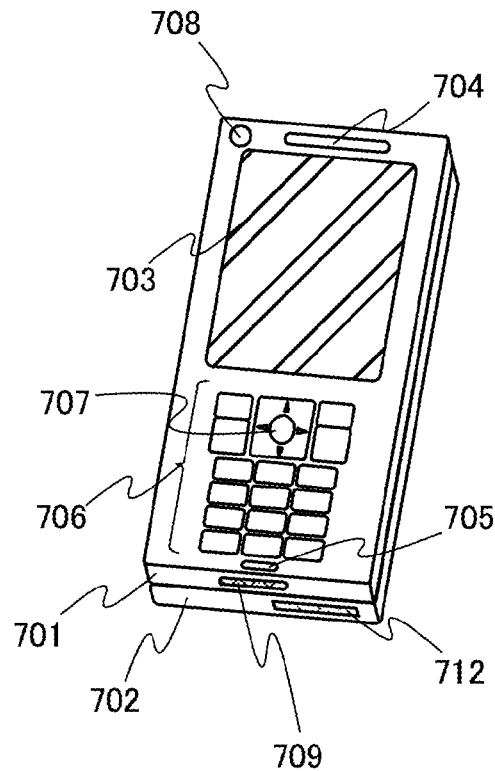
FIGS. 13A to 13C illustrate an electronic device including a semiconductor device according to an embodiment of the present invention.
Figure 13B:
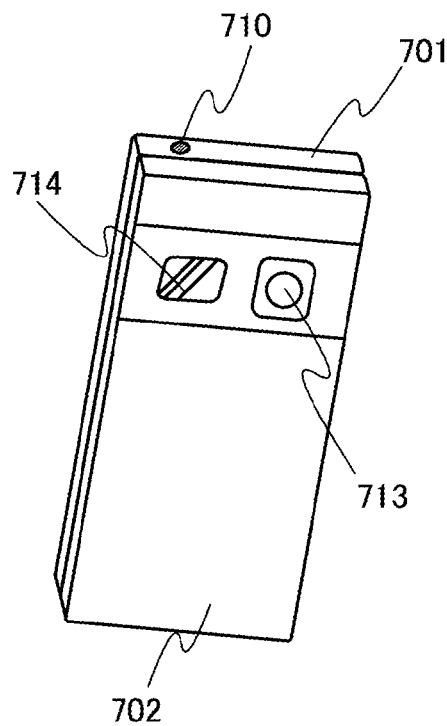
Figure 13C:
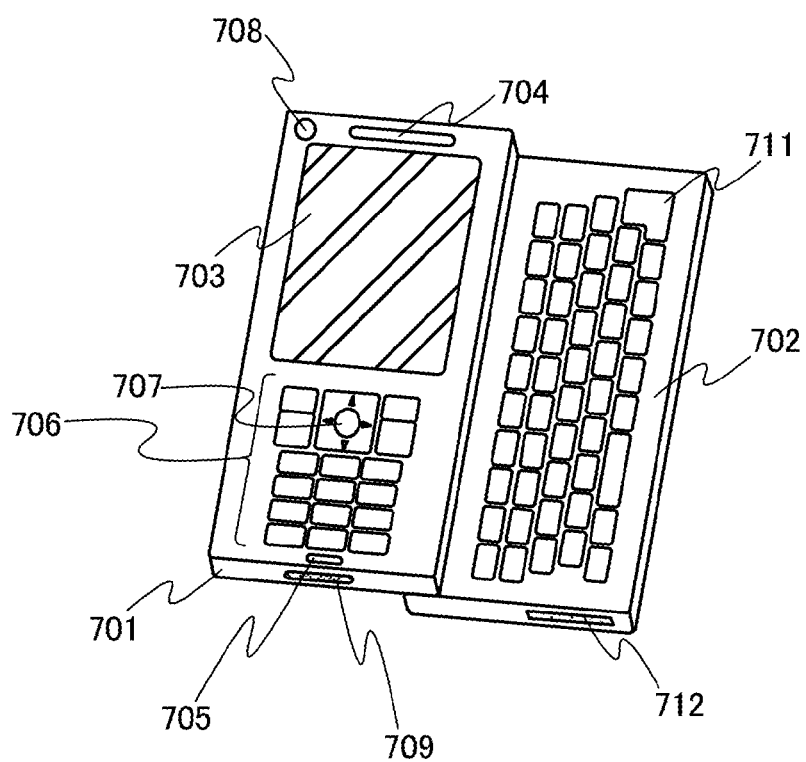

FIGS. 13A to 13C illustrate an example of a mobile phone. FIG. 13A is a front view, FIG. 13B is a rear view, and FIG. 13C is a development view when two housings slide. A mobile phone 700 includes two housings 701 and 702. The mobile phone 700 is a so-called smartphone which has both functions of a mobile phone and a portable information terminal, and incorporates a computer and can process a variety of data processing in addition to voice calls.

The mobile phone 700 includes the housing 701 and the housing 702. The housing 701 includes a display portion 703, a speaker 704, a microphone 705, operation keys 706, a pointing device 707, a front camera lens 708, a jack 709 for an external connection terminal, an earphone terminal 710, and the like, while the housing 702 includes a keyboard 711, an external memory slot 712, a rear camera 713, a light 714, and the like. In addition, an antenna is incorporated in the housing 701.

In addition to the above-described structure, a wireless IC chip, a small size memory device, or the like may be incorporated in the mobile phone 700.

The housings 701 and 702 overlapped with each other (illustrated in FIG. 13A) slide and can be developed as illustrated in FIG. 13C. The display panel or display device manufactured by the manufacturing method of a display device described in the above embodiment can be incorporated in the display portion 703. Since the display portion 703 and the front camera lens 708 are provided in the same plane, the mobile phone 700 can be used as a videophone. A still image and a moving image can be taken by the rear camera 713 and the light 714 by using the display portion 703 as a viewfinder.

By using the speaker 704 and the microphone 705, the mobile phone 700 can be used as an audio recording device (sound recorder) or an audio reproducing device. With use of the operation keys 706, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 700 as a portable information terminal, the use of the keyboard 711 is convenient. The housings 701 and 702 overlapped with each other (FIG. 13A) slide and can be developed as illustrated in FIG. 13C. In the case where the mobile phone 700 is used as a portable information terminal, smooth operation with the keyboard 711 and the pointing device 707 can be performed. The jack 709 for an external connection terminal can be connected to various cables such as an AC adopter or a USB cable, whereby the mobile phone 700 can be charged or can perform data communication with a personal computer or the like. Moreover, by inserting a recording medium into the external memory slot 712, the mobile phone 700 can deal with storing and moving a large capacity of data.

In the rear surface of the housing 702 (FIG. 13B), the rear camera 713 and the light 714 are provided, and a still image and a moving image can be taken by using the display portion 703 as a viewfinder.

Further, the mobile phone 700 may have an infrared communication function, a USB port, a function of receiving one segment television broadcast, a non-contact IC chip, an earphone jack, or the like, in addition to the above-described functions and structures.

Figure 14A:
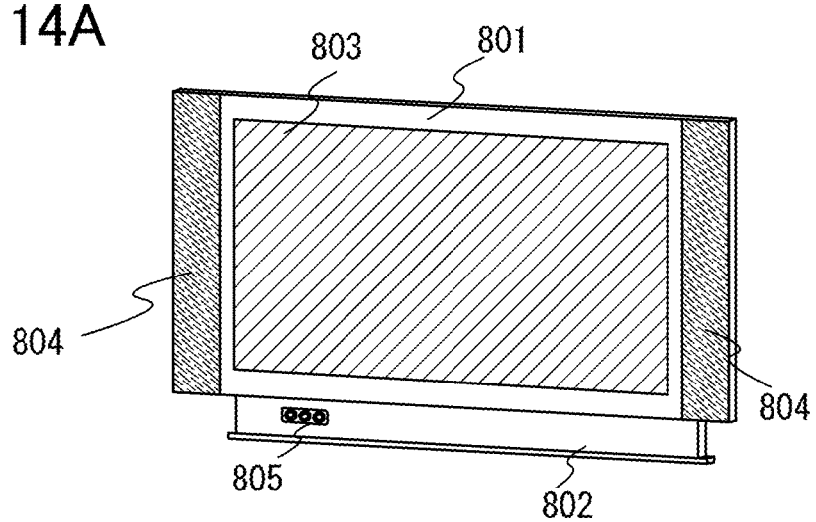
FIGS. 14A to 14C illustrate electronic devices each including a semiconductor device according to an embodiment of the present invention.

FIG. 14A illustrates a display device, which includes a housing 801, a supporting base 802, a display portion 803, a speaker portion 804, a video input terminal 805, and the like. Note that the display device includes all devices for displaying information, such as for a personal computer, for receiving TV broadcasting, and for displaying an advertisement.

Figure 14B:
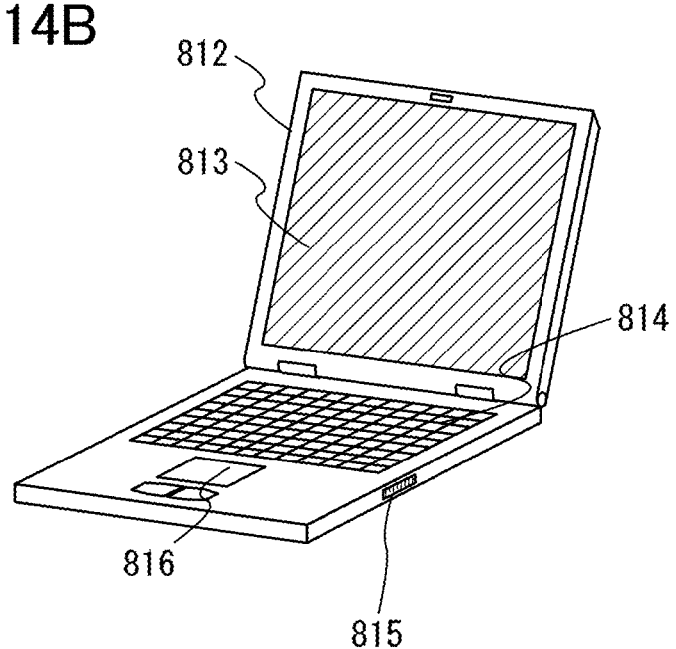

FIG. 14B illustrates a computer, which includes a housing 812, a display portion 813, a keyboard 814, an external connection port 815, a mouse 816, and the like.

Figure 14C:
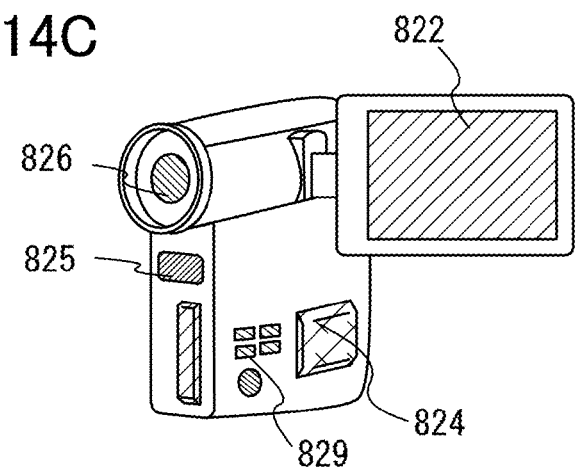

FIG. 14C illustrates a video camera, which includes a display portion 822, an external connection port 824, a remote control receiving portion 825, an image receiving portion 826, an operation key 829, and the like.

In a manufacturing process of a semiconductor device for various electronic devices described in this embodiment, a peripheral region of a semiconductor film and an insulating film formed over a glass substrate is removed, and a stacked conductive film having a low stress is used as a conductive film for forming a gate electrode. Accordingly, peeling of the semiconductor film and the insulating film due to stress that the stacked conductive film has can be prevented. Therefore, a semiconductor device which has high reliability sufficient for practical use can be manufactured. Furthermore, reduction in yield due to peeling of the semiconductor film and the insulating film during manufacture of a semiconductor device can be prevented.

Note that the structure described in this embodiment can be combined with any of the structures described in other embodiments as appropriate.

Example 1

In Example 1, comparison of film peeling of a semiconductor film and an insulating film when forming a stacked conductive film of a tantalum nitride film and a tungsten film over an SOI substrate was conducted with varying removal conditions of a peripheral region of the semiconductor film and the insulating film over a glass substrate and varying film formation conditions of the stacked conductive film. As for removal of the semiconductor film and the insulating film over the glass substrate, two kinds of removal conditions were employed: a condition for removing a peripheral region of only the semiconductor film (a condition for removing the semiconductor film) and a condition for removing a peripheral region of both the semiconductor film and the insulating film (a condition for removing the semiconductor film and the insulating film). Further, as for film formation of the stacked conductive film, two kinds of film formation conditions were employed: a condition for forming the stacked conductive film having a stress (a normal film formation condition) and a condition for the stacked conductive film to have a low stress (a low stress film formation condition). In other words, four kinds of substrates, which are a substrate A (a condition for removing the semiconductor film and a normal film formation condition), a substrate B (a condition for removing the semiconductor film and a low stress film formation condition), a substrate C (a condition for removing the semiconductor film and the insulating film and a normal film formation condition), and a substrate D (a condition for removing the semiconductor film and the insulating film and a low stress film formation condition), were fabricated and their boundaries between an upper surface of the glass substrate and the insulating film were observed with an optical microscope. The substrates were compared in terms of film peeling of the semiconductor film and the insulating film by the stacked conductive film.

As a bond substrate, a rectangular single crystal silicon substrate having a size of 5 inches on each side was used. First, a silicon oxynitride film and a silicon nitride oxide film each having a thickness of 50 nm were formed in this order over the single crystal silicon substrate by a CVD method, so that an insulating film was formed.

Next, hydrogen was ionized and added into the single crystal silicon substrate from a surface of the silicon nitride oxide film with an ion doping apparatus. In this example, by irradiation with ionized hydrogen, an embrittlement layer was formed in the single crystal silicon substrate. The ion doping was performed with an accelerating voltage of 35 kV at a dose of $2.2 \times 10^{16}$ ions/cm$^2$.

Next, a silicon oxide film was formed over the silicon nitride oxide film by a CVD method using a TEOS gas. Then, the single crystal silicon substrate was bonded to a glass substrate with the silicon oxide film interposed therebetween. Then, heat treatment was performed at 200° C. for 120 minutes, and was further performed at 600° C. for 120 minutes; thus, the single crystal silicon substrate was divided into a single crystal silicon film and the rest part that was a single crystal substrate after separation, along the embrittlement layer. At this time, the thickness of the single crystal silicon film was about 115 nm. Through the above-described process, an SOI substrate in which the single crystal silicon film was formed over the glass substrate with the insulating film of the silicon oxide film, the silicon nitride oxide film, and the silicon oxynitride film interposed therebetween was fabricated.

Next, a resist mask was formed over the single crystal silicon film by photolithography. The resist mask had a shape similar to the shape of the single crystal silicon film and had an outermost edge inward than the single crystal silicon film, where the distance between the outermost edge of the single crystal silicon film and an outermost edge of the resist mask was set at 6 mm.

Next, the single crystal silicon film was subjected to dry etching with a parallel-plate reactive ion etching (RIE) apparatus using a fluorine-based gas. The etching condition was such that the bias power of the parallel plate was 150 W, the pressure inside the chamber was 800 mTorr, the gas flow rate was SF$_6$: He=28 sccm: 12 sccm, and the etching time was 110 seconds. Further, the insulating film of each of the substrate C and the substrate D was subjected to dry etching as well. The etching condition was such that the bias power of the parallel plate was 350 W, the pressure inside the chamber was 200 mTorr, the gas flow rate was SF$_6$: He=20 sccm: 20 sccm, and the etching time was 120 seconds.

After the resist mask was removed by O$_2$ ashing, the entire surface of the single crystal silicon film was subjected to dry etching; accordingly, the thickness was reduced to about 95 nm. Then, the single crystal silicon film was irradiated with a laser beam in a nitrogen atmosphere, and the single crystal silicon film was further etched to a thickness of 60 nm.

Next, a pattern of the single crystal silicon film was formed, and a gate insulating film was formed to cover the formed island-shaped single crystal silicon film. As the gate insulating film, a silicon oxynitride film with a thickness of about 10 nm was formed by a CVD method.

Then, a stacked conductive film including a 30-nm-thick tantalum nitride film as a lower layer and a 370-nm-thick tungsten film as an upper layer was formed by a sputtering method as a conductive film for forming a gate electrode. For the substrate A and the substrate C, the stacked conductive film was formed under the condition for forming the stacked conductive film having a stress (the normal film formation condition). For the substrate B and the substrate D, the stacked conductive film was formed under the condition for the stacked conductive film to have a low stress (the low stress film formation condition).

In the normal film formation condition, first, the tantalum nitride film with a thickness of 30 nm was formed using tantalum as a target, at a film formation power of 1 kW, a film formation pressure of 0.6 Pa, and a gas flow rate of Ar (argon): N$_2$ (nitrogen)=50 sccm: 10 sccm. Next, the tungsten film with a thickness of 370 nm was formed using tungsten as a target, at a film formation power of 6 kW, a film formation pressure of 1.5 Pa, a substrate temperature of 230° C., and a gas flow rate of argon of 100 sccm. The stress of the stacked conductive film of tantalum nitride and tungsten formed under the normal film formation condition was measured and found to be −0.98 GPa. In addition, the stress of only a tungsten film formed with a thickness of 400 nm under the normal film formation condition was measured and found to be −0.20 GPa.

In the low stress film formation condition, the tantalum nitride film was formed in the same manner as the normal condition. The tantalum nitride film formed under this condition has a compressive stress; therefore, the tungsten film was formed to have a tensile stress which relieves the compressive stress. In the low stress film formation condition, the tungsten film was formed at low film formation power and high film formation pressure so as to have a higher tensile stress than the tungsten film formed under the normal condition. Accordingly, the tungsten film with a thickness of 370 nm was formed using tungsten as a target, at a film formation power of 4 kW, a film formation pressure of 2.0 Pa, a substrate temperature of 230° C., and a gas flow rate of argon of 100 sccm. The stress of the stacked conductive film of tantalum nitride and tungsten formed under the low stress film formation condition was measured and found to be −0.09 GPa. In addition, the stress of only a tungsten film formed with a thickness of 400 nm under the low stress film formation condition was measured and found to be 0.78 GPa.

Therefore, it is found that the tungsten film formed under the low stress film formation condition has a higher tensile stress than the tungsten film formed under the normal condition. It is likely that the compressive stress of the tantalum nitride film is relieved by the tensile stress of the tungsten film formed under the low stress film formation condition and accordingly the stacked conductive film formed under the low stress film formation condition has a low stress.

Figure 15A:
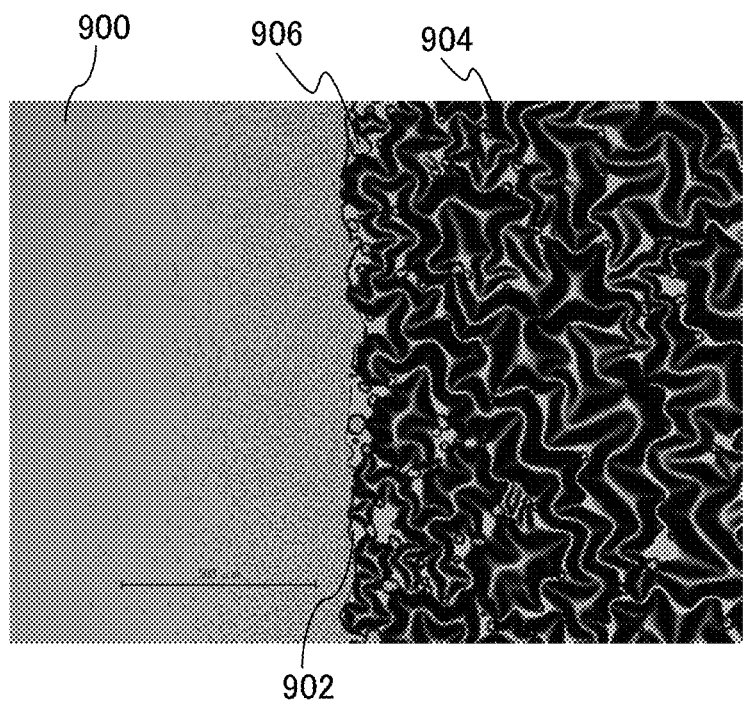
FIGS. 15A and 15B are optical microphotographs of a boundary between a glass substrate and a base insulating film.
Figure 15B:
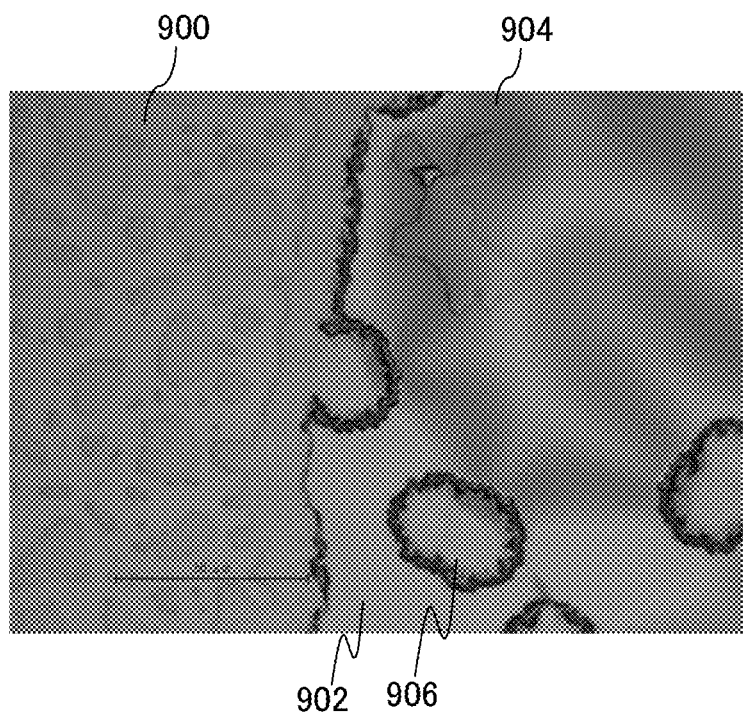

FIGS. 15A and 15B are optical microphotographs of a boundary between the glass substrate and the insulating film of the substrate A. FIG. 15A is a photograph taken at a magnification of ×50, and FIG. 15B is a photograph taken at a magnification of ×500. A glass substrate 900 is exposed in the left part of the photograph and an insulating film 902 is formed in the right part of the photograph. A stacked conductive film 904 is peeled by a compressive stress, and when seen in FIG. 15B particularly, the stacked conductive film 904 rises due to the compressive stress and the optical microphotograph is out of focus. Further, from FIGS. 15A and 15B, it appears that portions 906 where circular film peeling is caused in the insulating film 902 as well to expose the glass substrate are provided at many locations. The peripheral portion of the boundary between the glass substrate 900 and the insulating film 902 was entirely in the state as in FIGS. 15A and 15B, and part of the stacked conductive film 904 was peeled.

Figure 16A:
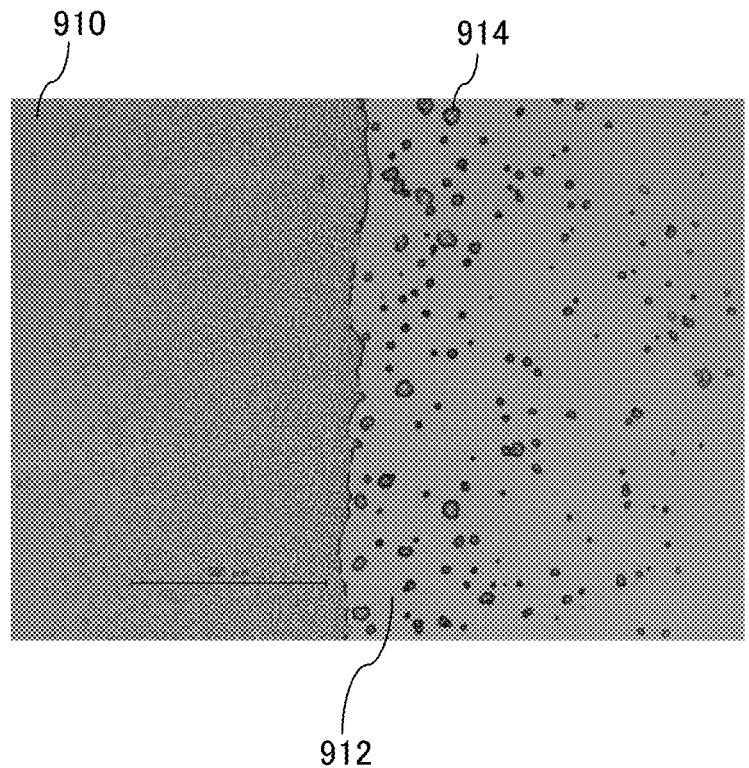
FIGS. 16A and 16B are optical microphotographs of a boundary between a glass substrate and a base insulating film.
Figure 16B:
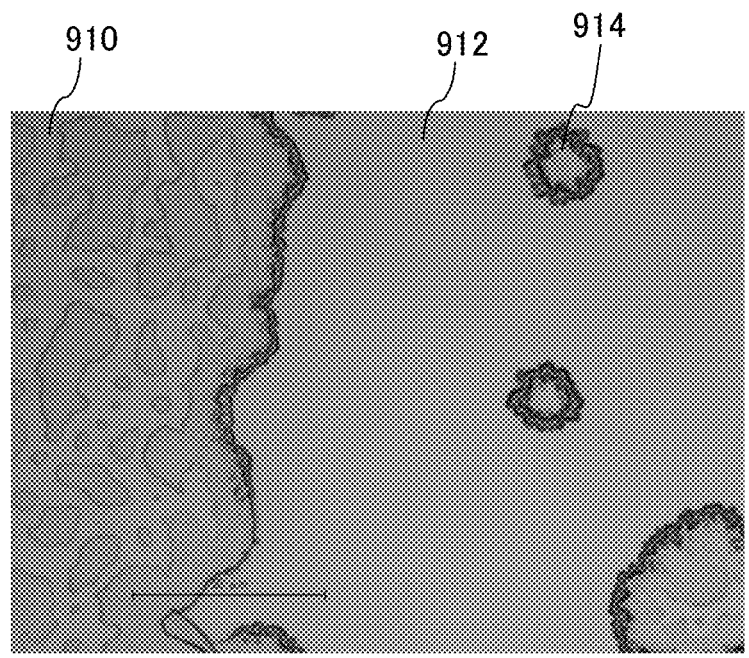

FIGS. 16A and 16B are optical microphotographs of a boundary between the glass substrate and the insulating film of the substrate B. FIG. 16A is a photograph taken at a magnification of ×50, and FIG. 16B is a photograph taken at a magnification of ×500. Similarly to FIGS. 15A and 15B, a glass substrate 910 is exposed in the left part of the photograph and an insulating film 912 is formed in the right part of the photograph. However, the stacked conductive film does not rise and is formed over the glass substrate and the base insulating film with favorable adhesion. This can also be noticed from the fact that the stacked conductive film which is out of focus is not shown in FIG. 16B. Although there are portions 914 where small circular film peeling is caused in the insulating film 912 to expose part of the glass substrate, the area of the exposed part is small as compared to the substrate A. Further, film peeling of the stacked conductive film and the base insulating film is seen in the entire peripheral portion of the boundary between the glass substrate 910 and the insulating film 912; however, the area of the film peeling of the stacked conductive film and the base insulating film is small as compared to the substrate A.

Figure 17A:
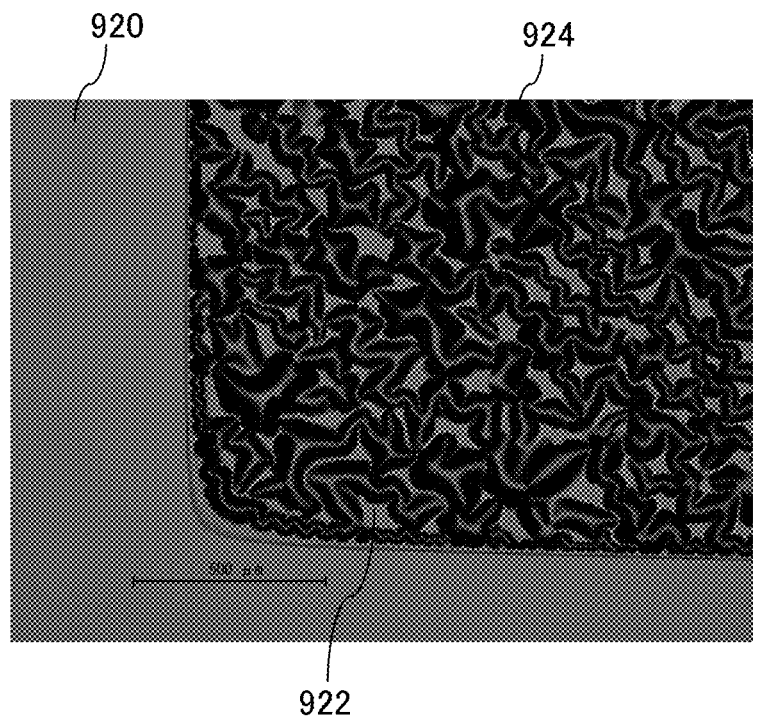
FIGS. 17A and 17B are optical microphotographs of boundaries each between a glass substrate and a base insulating film.

FIG. 17A is an optical microphotograph of a boundary between the glass substrate and the insulating film of the substrate C. The photograph is taken at a magnification of ×500. A glass substrate 920 is exposed in the left part and the lower part of the photograph and a semiconductor film 922 is formed in the upper right part of the photograph. Similarly to the substrate A, a stacked conductive film 924 rises due to the compressive stress; however, the size of the peeled part of the stacked conductive film 924 is small and the interval between the peeled parts of the stacked conductive film 924 is long, as compared to the substrate A. Further, there were some portions in which film peeling of the stacked conductive film was not caused in the entire peripheral portion of the boundary between the glass substrate 920 and the semiconductor film 922.

Figure 17B:
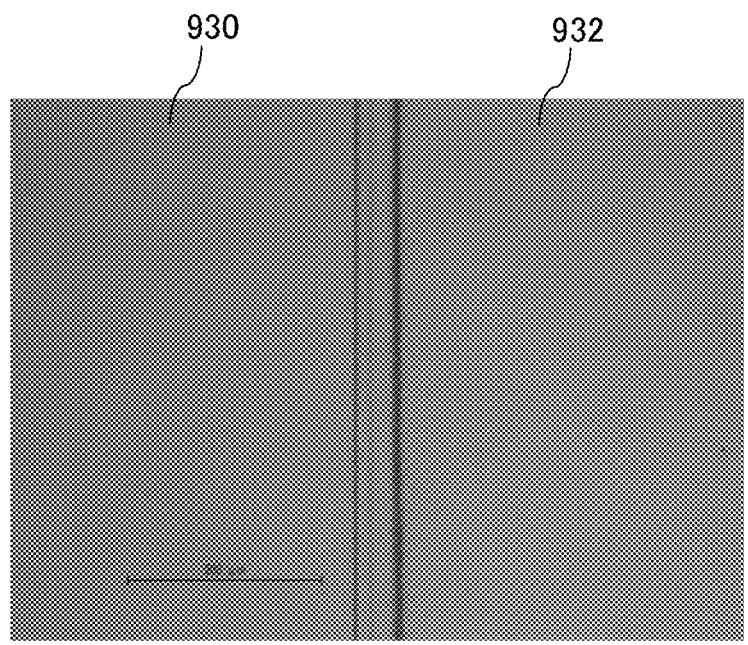

FIG. 17B is an optical microphotograph of a boundary between the glass substrate and the insulating film of the substrate D. FIG. 17B is a photograph taken at a magnification of ×500. A glass substrate 930 is exposed in the left part of the photograph and a semiconductor film 932 is formed in the right part of the photograph. The stacked conductive film does not rise and is formed over the glass substrate and the semiconductor film with favorable adhesion. Further, it does not seem that the semiconductor film 932 and the insulating film below the semiconductor film 932 are peeled to expose the glass substrate in a circular shape. It was observed that all of the insulating film, the semiconductor film, and the stacked conductive film over the glass substrate are not peeled in the entire peripheral portion of the boundary between the glass substrate and the semiconductor film.

From the above, it was confirmed that film peeling of the insulating film, the semiconductor film, and the stacked conductive film due to the stress applied by the stacked conductive film can be suppressed by removal of the peripheral region where the adhesion between the glass substrate, and the insulating film and the semiconductor film over the glass substrate is low and by film formation of the stacked conductive film for forming a gate electrode under the low stress film formation condition.

This application is based on Japanese Patent Application serial no. 2008-233270 filed with Japan Patent Office on Sep. 11, 2008, the entire contents of which are hereby incorporated by reference.

What is claimed is:

1. A manufacturing method of a semiconductor device comprising the steps of:
    forming an insulating film over a bond substrate;
    forming an embrittlement layer by adding ions from a surface of the bond substrate;
    bonding the bond substrate to a glass substrate with the insulating film interposed therebetween;
    separating the bond substrate along the embrittlement layer to form a first semiconductor film over the glass substrate with the insulating film interposed therebetween;
    removing a peripheral region of the insulating film and the first semiconductor film to expose a part of the glass substrate, wherein the insulating film and the first semiconductor film are formed to be a rectangular shape with rounded four corners;
    forming at least second and third semiconductor films by etching the first semiconductor film;
    forming a gate insulating film over and in contact with the second and the third semiconductor films, a portion of the insulating film between the second and the third semiconductor films, and the part of the glass substrate; and
    forming a stacked conductive film over and in contact with the gate insulating film,
    wherein the stacked conductive film includes a conductive film having a tensile stress and a conductive film having a compressive stress.

2. The manufacturing method of the semiconductor device according to claim 1,
    wherein the peripheral region is a band-like region from an outermost edge of the first semiconductor film to a place which is 1 mm to 10 mm inward than the outermost edge of the first semiconductor film.

3. The manufacturing method of the semiconductor device according to claim 1,
    wherein the removing the peripheral region is performed by dry etching.

4. The manufacturing method of the semiconductor device according to claim 1,
    wherein the insulating film is a single film or a stacked layer of a plurality of films selected from a silicon oxide film, a silicon nitride film, a silicon oxynitride film, or a silicon nitride oxide film.

5. The manufacturing method of the semiconductor device according to claim 4,
    wherein the silicon oxide film is formed by thermally oxidizing the bond substrate.

6. The manufacturing method of the semiconductor device according to claim 1,
    wherein the bond substrate is a single crystal silicon substrate.

7. The manufacturing method of the semiconductor device according to claim 1,
wherein the glass substrate is aluminosilicate glass, barium borosilicate glass, or aluminoborosilicate glass.

8. The manufacturing method of the semiconductor device according to claim 1,
wherein the method further comprises a step of separating the first semiconductor film after removing the peripheral region to expose a part of the insulating film, and
wherein the gate insulating film is formed over and in contact with the part of the insulating film.

9. A manufacturing method of a semiconductor device comprising the steps of:
forming an insulating film over a bond substrate;
forming an embrittlement layer by adding ions from a surface of the bond substrate;
bonding the bond substrate to a glass substrate with the insulating film interposed therebetween;
separating the bond substrate along the embrittlement layer to form a first semiconductor film over the glass substrate with the insulating film interposed therebetween;
removing a peripheral region of the insulating film and the first semiconductor film to expose a part of the glass substrate, wherein the insulating film and the first semiconductor film are formed to be a rectangular shape with rounded four corners;
forming at least second and third semiconductor films by etching the first semiconductor film;
forming a gate insulating film over and in contact with the second and the third semiconductor films, a portion of the insulating film between the second and the third semiconductor films, and the part of the glass substrate; and
forming a stacked conductive film with a two-layer structure over and in contact with the gate insulating film,
wherein the stacked conductive film with the two-layer structure includes a conductive film having a tensile stress in an upper layer and a conductive film having a compressive stress in a lower layer.

10. The manufacturing method of the semiconductor device according to claim 9,
wherein the conductive film having the tensile stress is a tungsten film, and
wherein the conductive film having the compressive stress is a tantalum nitride film.

11. The manufacturing method of the semiconductor device according to claim 9,
wherein the peripheral region is a band-like region from an outermost edge of the first semiconductor film to a place which is 1 mm to 10 mm inward than the outermost edge of the first semiconductor film.

12. The manufacturing method of the semiconductor device according to claim 9,
wherein the removing the peripheral region is performed by dry etching.

13. The manufacturing method of the semiconductor device according to claim 9,
wherein the insulating film is a single film or a stacked layer of a plurality of films selected from a silicon oxide film, a silicon nitride film, a silicon oxynitride film, or a silicon nitride oxide film.

14. The manufacturing method of the semiconductor device according to claim 13,
wherein the silicon oxide film is formed by thermally oxidizing the bond substrate.

15. The manufacturing method of the semiconductor device according to claim 9,
wherein the bond substrate is a single crystal silicon substrate.

16. The manufacturing method of the semiconductor device according to claim 9,
wherein the glass substrate is aluminosilicate glass, barium borosilicate glass, or aluminoborosilicate glass.

17. The manufacturing method of the semiconductor device according to claim 9,
wherein the method further comprises a step of separating the first semiconductor film after removing the peripheral region to expose a part of the insulating film, and
wherein the gate insulating film is formed over and in contact with the part of the insulating film.

18. A manufacturing method of a semiconductor device comprising the steps of:
forming a first insulating film over a bond substrate;
forming an embrittlement layer by adding ions from a surface of the bond substrate;
forming a second insulating film over a glass substrate;
bonding the bond substrate to the second insulating film over the glass substrate with the first insulating film interposed therebetween;
separating the bond substrate along the embrittlement layer to form a first semiconductor film over the glass substrate with the first insulating film and the second insulating film interposed therebetween;
removing a peripheral region of the first insulating film, the second insulating film, and the first semiconductor film to expose a part of the glass substrate, wherein the insulating film, the second insulating film, and the first semiconductor film are formed to be a rectangular shape with rounded four corners;
forming at least second and third semiconductor films by etching the first semiconductor film;
forming a gate insulating film over and in contact with the second and the third semiconductor films, a portion of the first insulating film between the second and the third semiconductor films, and the part of the glass substrate; and
forming a stacked conductive film with a two-layer structure over and in contact with the gate insulating film,
wherein the stacked conductive film with the two-layer structure includes a conductive film having a tensile stress in an upper layer and a conductive film having a compressive stress in a lower layer.

19. The manufacturing method of the semiconductor device according to claim 18,
wherein the conductive film having the tensile stress is a tungsten film, and
wherein the conductive film having the compressive stress is a tantalum nitride film.

20. The manufacturing method of the semiconductor device according to claim 18,
wherein the peripheral region is a band-like region from an outermost edge of the second insulating film to a place which is 1 mm to 10 mm inward than the outermost edge of the first semiconductor film.

21. The manufacturing method of the semiconductor device according to claim 18,
wherein the removing the peripheral region is performed by dry etching.

22. The manufacturing method of the semiconductor device according to claim 18,
wherein the first insulating film is a single film or a stacked layer of a plurality of films selected from a silicon oxide film, a silicon nitride film, a silicon oxynitride film, or a silicon nitride oxide film.

23. The manufacturing method of the semiconductor device according to claim 22,
wherein the silicon oxide film is formed by thermally oxidizing the bond substrate.

24. The manufacturing method of the semiconductor device according to claim 18,
wherein the second insulating film is a film selected from a silicon nitride film, a silicon nitride oxide film, an aluminum nitride film, or an aluminum nitride oxide film.

25. The manufacturing method of the semiconductor device according to claim 18,
wherein the bond substrate is a single crystal silicon substrate.

26. The manufacturing method of the semiconductor device according to claim 18,
wherein the glass substrate is aluminosilicate glass, barium borosilicate glass, or aluminoborosilicate glass.

27. The manufacturing method of the semiconductor device according to claim 18,
wherein the method further comprises a step of separating the first semiconductor film after removing the peripheral region to expose a part of the first insulating film, and
wherein the gate insulating film is formed over and in contact with the part of the first insulating film.

28. A manufacturing method of a semiconductor device comprising the steps of:
forming an insulating film over a bond substrate;
forming an embrittlement layer by adding ions from a surface of the bond substrate;
bonding the bond substrate to a glass substrate with the insulating film interposed therebetween;
separating the bond substrate along the embrittlement layer to form a first semiconductor film over the glass substrate with the insulating film interposed therebetween;
removing a peripheral region of the insulating film and the first semiconductor film to expose a part of the glass substrate, wherein the insulating film and the first semiconductor film are formed to be a rectangular shape with rounded four corners;
forming at least second and third semiconductor films by etching the first semiconductor film;
forming a gate insulating film over and in contact with the second and the third semiconductor films, a portion of the insulating film between the second and the third semiconductor films, and the part of the glass substrate; and
forming a stacked conductive film over and in contact with the gate insulating film,
wherein the stacked conductive film is formed under such conditions that the stacked conductive film has a stress of 0.1 GPa or lower.

29. The manufacturing method of the semiconductor device according to claim 28,
wherein the stacked conductive film has a two-layer structure including a tungsten film in an upper layer and a tantalum nitride film in a lower layer.

30. The manufacturing method of the semiconductor device according to claim 28,
wherein the peripheral region is a band-like region from an outermost edge of the first semiconductor film to a place which is 1 mm to 10 mm inward than the outermost edge of the first semiconductor film.

31. The manufacturing method of the semiconductor device according to claim 28,
wherein the removing the peripheral region is performed by dry etching.

32. The manufacturing method of the semiconductor device according to claim 28,
wherein the insulating film is a single film or a stacked layer of a plurality of films selected from a silicon oxide film, a silicon nitride film, a silicon oxynitride film, or a silicon nitride oxide film.

33. The manufacturing method of the semiconductor device according to claim 32,
wherein the silicon oxide film is formed by thermally oxidizing the bond substrate.

34. The manufacturing method of the semiconductor device according to claim 28,
wherein the bond substrate is a single crystal silicon substrate.

35. The manufacturing method of the semiconductor device according to claim 28,
wherein the glass substrate is aluminosilicate glass, barium borosilicate glass, or aluminoborosilicate glass.

36. The manufacturing method of the semiconductor device according to claim 28,
wherein the method further comprises a step of separating the first semiconductor film after removing the peripheral region to expose a part of the insulating film, and
wherein the gate insulating film is formed over and in contact with the part of the insulating film.

37. A manufacturing method of a semiconductor device comprising the steps of:
forming a first insulating film over a bond substrate;
forming an embrittlement layer by adding ions from a surface of the bond substrate;
forming a second insulating film over a glass substrate;
bonding the bond substrate to the second insulating film over the glass substrate with the first insulating film interposed therebetween;
separating the bond substrate along the embrittlement layer to form a first semiconductor film over the glass substrate with the first insulating film and the second insulating film interposed therebetween;
removing a peripheral region of the first insulating film, the second insulating film, and the first semiconductor film to expose a part of the glass substrate, wherein the insulating film, the second insulating film, and the first semiconductor film are formed to be a rectangular shape with rounded four corners;
forming at least second and third semiconductor films by etching the first semiconductor film;
forming a gate insulating film over and in contact with the second and the third semiconductor films, a portion of the first insulating film between the second and the third semiconductor films, and the part of the glass substrate; and
forming a stacked conductive film over and in contact with the gate insulating film,
wherein the stacked conductive film is formed under such conditions that the stacked conductive film has a stress of 0.1 GPa or lower.

38. The manufacturing method of the semiconductor device according to claim 37,
wherein the stacked conductive film has a two-layer structure including a tungsten film in an upper layer and a tantalum nitride film in a lower layer.

39. The manufacturing method of the semiconductor device according to claim 37,
wherein the peripheral region is a band-like region from an outermost edge of the second insulating film to a place which is 1 mm to 10 mm inward than the outermost edge of the first semiconductor film.

40. The manufacturing method of the semiconductor device according to claim 37,
wherein the removing the peripheral region is performed by dry etching.

41. The manufacturing method of the semiconductor device according to claim 37,
wherein the first insulating film is a single film or a stacked layer of a plurality of films selected from a silicon oxide film, a silicon nitride film, a silicon oxynitride film, or a silicon nitride oxide film.

42. The manufacturing method of the semiconductor device according to claim 41,
wherein the silicon oxide film is formed by thermally oxidizing the bond substrate.

43. The manufacturing method of the semiconductor device according to claim 37,
wherein the second insulating film is a film selected from a silicon nitride film, a silicon nitride oxide film, an aluminum nitride film, or an aluminum nitride oxide film.

44. The manufacturing method of the semiconductor device according to claim 37,
wherein the bond substrate is a single crystal silicon substrate.

45. The manufacturing method of the semiconductor device according to claim 37,
wherein the glass substrate is aluminosilicate glass, barium borosilicate glass, or aluminoborosilicate glass.

46. The manufacturing method of the semiconductor device according to claim 37,
wherein the method further comprises a step of separating the first semiconductor film after removing the peripheral region to expose a part of the first insulating film, and
wherein the gate insulating film is formed over and in contact with the part of the first insulating film.

* * * * *